(12) United States Patent
Fu et al.

(10) Patent No.: US 11,562,960 B2
(45) Date of Patent: Jan. 24, 2023

(54) SEMICONDUCTOR DEVICE STRUCTURE AND METHOD FOR FORMING THE SAME

(71) Applicant: MediaTek Inc., Hsin-Chu (TW)

(72) Inventors: Chuan-Shian Fu, Hsin-Chu (TW); Shao-Hwang Sher, Hsin-Chu (TW)

(73) Assignee: MediaTek Inc., Hsin-Chu (TW)

( * ) Notice: Subject to any disclaimer, the term of this patent is extended or adjusted under 35 U.S.C. 154(b) by 0 days.

(21) Appl. No.: 17/519,313

(22) Filed: Nov. 4, 2021

(65) Prior Publication Data
US 2022/0059461 A1 Feb. 24, 2022

Related U.S. Application Data

(62) Division of application No. 16/384,655, filed on Apr. 15, 2019, now Pat. No. 11,195,796.
(Continued)

(51) Int. Cl.
| | | |
|---|---|---|
| *H01L 21/822* | (2006.01) | |
| *H01L 23/528* | (2006.01) | |
| *H01L 21/02* | (2006.01) | |
| *H01L 21/306* | (2006.01) | |
| *H01L 29/06* | (2006.01) | |
| *H01L 29/423* | (2006.01) | |

(Continued)

(52) U.S. Cl.
CPC .... *H01L 23/5286* (2013.01); *H01L 21/02532* (2013.01); *H01L 21/02603* (2013.01); *H01L 21/30604* (2013.01); *H01L 29/0673* (2013.01); *H01L 29/42392* (2013.01); *H01L 29/66545* (2013.01); *H01L 29/66742* (2013.01); *H01L 29/78618* (2013.01); *H01L 29/78696* (2013.01)

(58) Field of Classification Search
CPC .................. H01L 21/822; H01L 21/30604
See application file for complete search history.

(56) References Cited

U.S. PATENT DOCUMENTS 9,490,335 B1  11/2016  Doris et al.
9,847,391 B1 * 12/2017  Zang .................... H01L 29/775
(Continued)

FOREIGN PATENT DOCUMENTS

CN       104054181 A       9/2014
CN       106024582 A      10/2016
(Continued)

OTHER PUBLICATIONS

Extended European Search Report for European Application No. 19171834.5 dated Oct. 11, 2019.

*Primary Examiner* — Mohammad M Choudhry
(74) *Attorney, Agent, or Firm* — Wolf, Greenfield & Sacks, P.C.

(57) ABSTRACT

A semiconductor device structure includes a gate structure, first epitaxial structures, a power rail, and a second epitaxial structure. The gate structure is disposed on a substrate extending in a first direction. The first epitaxial structures are surrounded by a contact structure disposed on opposite sides of the gate structure extending in the first direction. The power rail is spaced apart from the gate structure and the first epitaxial structures. The power rail extends in the second direction, which is perpendicular to the first direction. The second epitaxial structure is surrounded by the contact structure disposed directly beneath the power rail. The second epitaxial structure is electrically connected to the power rail.

12 Claims, 37 Drawing Sheets

Related U.S. Application Data

(60) Provisional application No. 62/674,078, filed on May 21, 2018, provisional application No. 62/668,284, filed on May 8, 2018.

(51) Int. Cl.
*H01L 29/66* (2006.01)
*H01L 29/786* (2006.01)

(56) References Cited

U.S. PATENT DOCUMENTS

| | | |
|---|---|---|
| 11,195,796 B2 | 12/2021 | Fu et al. |
| 2014/0246791 A1 | 9/2014 | Stephens et al. |
| 2015/0340457 A1 | 11/2015 | Xie et al. |
| 2017/0117359 A1 | 4/2017 | Cheng et al. |
| 2017/0148922 A1 | 5/2017 | Hatcher et al. |
| 2017/0287844 A1 | 10/2017 | Or-Bach et al. |
| 2019/0348367 A1 | 11/2019 | Fu et al. |

FOREIGN PATENT DOCUMENTS

| | | |
|---|---|---|
| CN | 106653756 A | 5/2017 |
| CN | 107871780 A | 4/2018 |
| WO | WO 2017/053329 A1 | 3/2017 |

\* cited by examiner

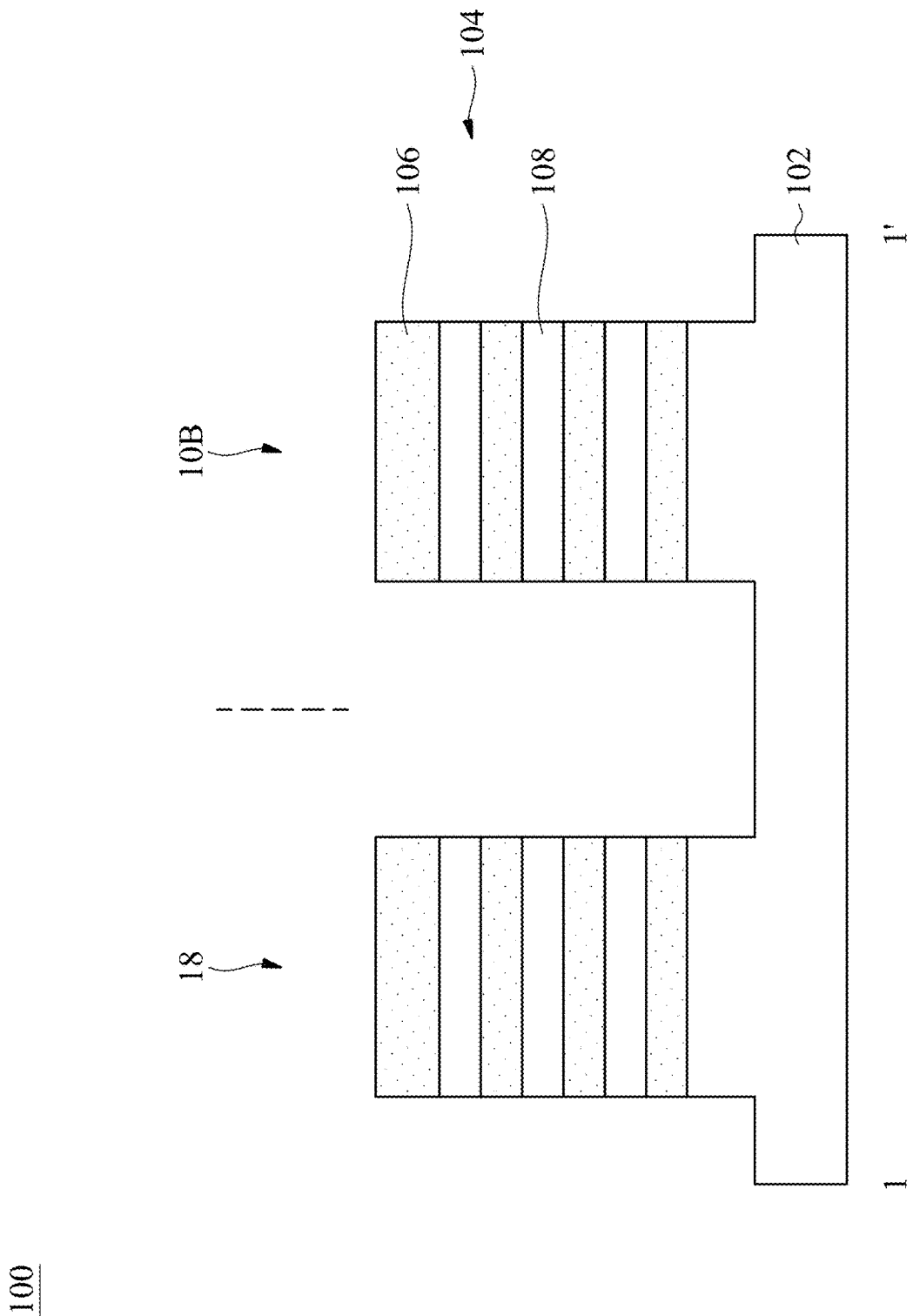

SEMICONDUCTOR DEVICE STRUCTURE AND METHOD FOR FORMING THE SAME

CROSS REFERENCE TO RELATED APPLICATIONS

This application is a Division of U.S. application Ser. No. 16/384,655, filed Apr. 15, 2019, entitled "SEMICONDUCTOR DEVICE STRUCTURE AND METHOD FOR FORMING THE SAME", which claims the benefit of U.S. Provisional Application No. 62/674,078, filed on May 21, 2018, entitled "POWER RAIL RESISTANCE IMPROVEMENT FOR GATE-ALL-AROUND NANO-SHEET/NANO-WIRE DEVICE ARCHITECTURE" and U.S. Provisional Application No. 62/668,284, filed on May 8, 2018, entitled "PLATE RESISTOR FOR GATE-ALL-AROUND NANO-SHEET DEVICE ARCHITECTURE," the entirety of each of which is incorporated by reference herein.

BACKGROUND

Technical Field

The disclosure relates to a semiconductor structure, and more particularly to a nanosheet field effect transistor device structure and a method for forming a nanosheet field effect transistor device structure.

Description of the Related Art

The semiconductor integrated circuit industry has experienced rapid growth. The development of integrated-circuit design and advancements in materials technology has produced generations of integrated circuits. Each generation has smaller and more complex circuits than the previous generation. In the process of integrated-circuit development, geometric size has gradually been reduced.

The gate-all around (GAA) nanosheet (NS) device has been introduced in an effort to improve gate control by increasing gate and channel coupling, reduce OFF-state leakage current, and reduce short-channel effects (SCE). A gate-all around nanosheet device has a gate stack wrapped around the channel region providing access to the channel on four sides. The gate-all around nanosheet device provides a channel in a silicon nanosheet.

As integrated circuits have shrunk, the size of the transistor and metal lines has decreased. Therefore, the power rail resistance may increase, and the IR drop may lead to poor circuit performance and worse electron migration (EM). Moreover, a conventional Hi-R resistor incurs an extra cost for the mask and takes up more chip area.

Although existing nanosheet field effect transistor device structures have generally been adequate for their intended purposes, they have not been entirely satisfactory in all respects, and need to be improved. This is especially true of the control of the power rail resistance and a resistor with lower cost.

BRIEF SUMMARY

The present disclosure provides a nanosheet field effect transistor device structure, including a gate structure, first epitaxial structures, a power rail, and a second epitaxial structure. The gate structure is disposed on a substrate extending in a first direction. The first epitaxial structures are surrounded by a contact structure disposed on opposite sides of the gate structure extending in the first direction. The power rail is spaced apart from the gate structure and the first epitaxial structures. The power rail extends in the second direction, which is perpendicular to the first direction. The second epitaxial structure surrounded by the contact structure disposed directly beneath the power rail. The second epitaxial structure is electrically connected to the power rail.

The present disclosure also provides a method for forming a nanosheet field effect transistor device structure. The method includes forming a nanosheet stack comprising vertically alternately stacked first semiconductor layers and second semiconductor layers on a substrate. The substrate includes a device region and a boundary region. The device region includes a channel region and a source/drain region. The method also includes removing the nanosheet stack and forming epitaxial structures in the source/drain region and the boundary region. The method also includes removing the first semiconductor layers of the nanosheet stack in the channel region and forming a gate stack surrounding the second semiconductor layers. The method also includes forming a contact structure surrounding the epitaxial structures in the source/drain region and the boundary region. The method also includes forming a power rail in the boundary region directly above the epitaxial structure in the boundary region. The power rail is electrically connected to the epitaxial structure in the boundary region. The epitaxial structures in the source/drain region and the epitaxial structures in the boundary region are spaced apart from each other.

The present disclosure further provides a nanosheet field effect transistor device structure, including first gate structures, a first epitaxial structure, and a pair of first contact structures. The first gate structures are disposed on a substrate. The first epitaxial structure is disposed between the first gate structures. The pair of first contact structures are disposed on opposite sides of the first epitaxial structure. The pair of first contact structures surround a portion of the first epitaxial structure, and the pair of first contact structures are spaced apart from each other by the first epitaxial structure.

A detailed description is given in the following embodiments with reference to the accompanying drawings.

BRIEF DESCRIPTION OF DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIGS. 2A-1, 2A-2, 2A-3, 2B-1, 2B-2, 2B-3, 2C-1, 2C-2, 2C-3, 2D-1, 2D-2, 2D-3, 2E-1, 2E-2, 2E-3, 2F-1, 2F-2, 2F-3, 2G-1, 2G-2, 2G-3 are cross-sectional representations of various stages of forming a nanosheet field effect transistor device structure in accordance with some embodiments.

DETAILED DESCRIPTION

Figure 1:
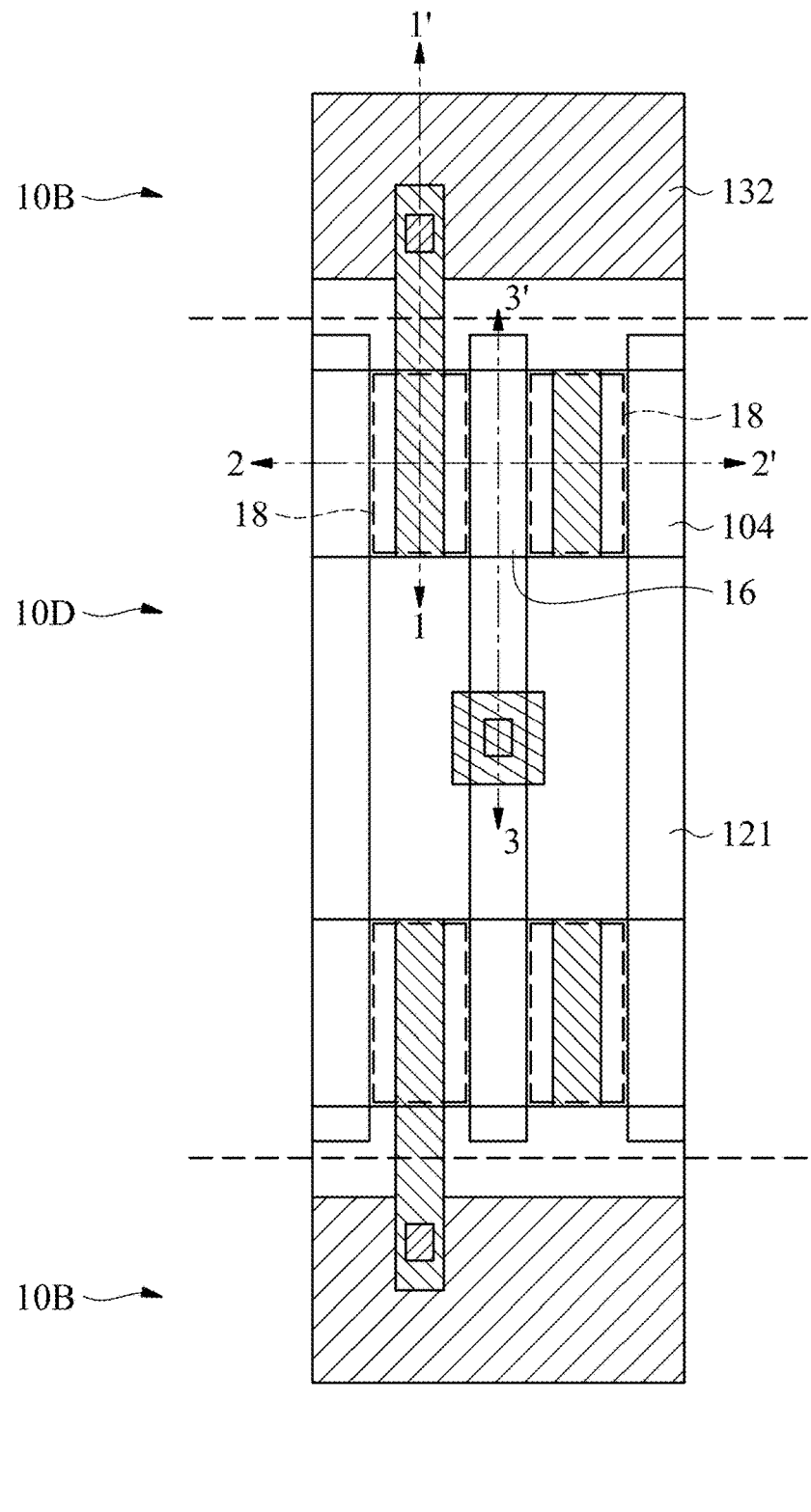
FIG. 1 is a top view of a nanosheet field effect transistor device structure in accordance with some embodiments.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to other elements or features as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Herein, the terms "around," "about," "substantial" usually mean within 20% of a given value or range, preferably within 10%, and better within 5%, or 3%, or 2%, or 1%, or 0.5%. It should be noted that the quantity herein is a substantial quantity, which means that the meaning of "around," "about," "substantial" are still implied even without specific mention of the terms "around," "about," "substantial."

Although some embodiments are discussed with operations performed in a particular order, these operations may be performed in another logical order. In different embodiments, additional operations can be provided before, during, and/or after the stages described the present disclosure. Some of the stages that are described can be replaced or eliminated for different embodiments. Additional features can be added to the semiconductor structure in the present disclosure. Some of the features described below can be replaced or eliminated for different embodiments.

The embodiments of the present disclosure provide a nanosheet field effect transistor device structure. By forming an epitaxial structure under the power rail and electrically connected to the power rail, the power rail resistance may be reduced and the circuit performance may be enhanced and the electron migration (EM) may be mitigated. Moreover, by forming contact structures on opposite sides of the epitaxial structures, a resistor producing in the front-end process is provided. The chip area and the cost for the mask may be further reduced.

FIG. 1 is a top view of a nanosheet field effect transistor device structure 100 in accordance with some embodiments. FIGS. 2A-1, 2A-2, 2A-3, 2B-1, 2B-2, 2B-3, 2C-1, 2C-2, 2C-3, 2D-1, 2D-2, 2D-3, 2E-1, 2E-2, 2E-3, 2F-1, 2F-2, 2F-3, 2G-1, 2G-2, 2G-3 are cross-sectional representations of various stages of forming a nanosheet field effect transistor device structure 100 shown in FIG. 1 in accordance with some embodiments. FIGS. 2A-1, 2B-1, 2C-1, 2D-1, 2E-1, 2F-1, 2G-1 show cross-sectional representations taken along line 1-1' in FIG. 1. FIGS. 2A-2, 2B-2, 2C-2, 2D-2, 2E-2, 2F-2, 2G-2 show cross-sectional representations taken along line 2-2' in FIG. 1. FIGS. 2A-3, 2B-3, 2C-3, 2D-3, 2E-3, 2F-3, 2G-3 show cross-sectional representations taken along line 3-3' in FIG. 1.

As shown in FIG. 1 in accordance with some embodiments, the nanosheet field effect transistor device structure 100 includes a device region 10D and a boundary region 10B. The device region 10D includes gate structures 121 extending in the Y direction and a nanosheet stack 104 extending in the X direction. The nanosheet stack 104 in the device region 10D includes a channel region 16 under the gate structures 121 and a source/drain region 18 between the gate structures 121. The boundary region 10B includes a power rail 132 and another nanosheet stack 104 (not shown) extending in the X direction. The nanosheet stack 104 in the boundary region 10B is formed directly beneath the power rail 132 and electrically connected to the power rail 132. The source/drain region 18 is electrically connected to the power rail 132, as shown in FIG. 1 in accordance with some embodiments. By forming a nanosheet stack 104 in the boundary region 10B is formed directly beneath the power rail 132 and electrically connected to the power rail 132, the power rail resistance may be decreased.

The following description describes the forming method of the nanosheet field effect transistor device structure 100 in FIG. 1. A substrate 102 is provided as shown in FIGS. 2A-1, 2A-2, and 2A-3 in accordance with some embodiments. The substrate 102 may be a semiconductor wafer such as a silicon wafer. The substrate 102 may also include other elementary semiconductor materials, compound semiconductor materials, and/or alloy semiconductor materials. Examples of the elementary semiconductor materials may include, but are not limited to, crystal silicon, polycrystalline silicon, amorphous silicon, germanium, and/or diamond. Examples of the compound semiconductor materials may include, but are not limited to, silicon carbide, gallium nitride, gallium arsenic, gallium phosphide, indium phosphide, indium arsenide, and/or indium antimonide. Examples of the alloy semiconductor materials may include, but are not limited to, SiGe, GaAsP, AlInAs, AlGaAs, GaInAs, GaInP, and/or GaInAsP. In some embodiments, the substrate 102 includes an epitaxial layer. For example, the substrate 102 has an epitaxial layer overlying a bulk semiconductor. In addition, the substrate 102 may also be semiconductor on insulator (SOI). The SOI substrate may be fabricated by a wafer bonding process, a silicon film transfer process, a separation by implantation of oxygen (SIMOX)

process, other applicable methods, or a combination thereof. In some embodiments, the substrate 102 may be an N-type substrate. In some embodiments, the substrate 102 may be a P-type substrate.

Next, a nanosheet stack 104 is formed on the substrate 102, as shown in FIGS. 1, 2A-1, 2A-2, and 2A-3 in accordance with some embodiments. The nanosheet stack 104 may include first semiconductor layers 106 and second semiconductor layers 108 vertically alternately stacked over the substrate 102. It should be noted that, although there are four layers of the first semiconductor layers 106 and three layers of the second semiconductor layers 108 in the embodiments shown in FIGS. 2A-1, 2A-2, and 2A-3, the number of first semiconductor layers 106 and the second semiconductor layers 108 is not limited thereto.

The first semiconductor layers 106 may be made of silicon, silicon germanium, germanium tin, silicon germanium tin, gallium arsenide, indium gallium arsenide, indium arsenide, another suitable material, or a combination thereof. The semiconductor material layers 108 may be made of silicon, silicon germanium, germanium tin, silicon germanium tin, gallium arsenide, indium gallium arsenide, indium arsenide, another suitable material, or a combination thereof. In some embodiments, the first semiconductor layers 106 and the second semiconductor material layers 108 are made of different materials. For example, the first semiconductor layers 106 are made of silicon germanium, and the second semiconductor material layers 108 are made of silicon.

The first semiconductor material layers 106 and the second semiconductor material layers 108 may be formed by an epitaxial growth process. Each of the first semiconductor material layers 106 and the second semiconductor material layers 108 may be formed by a selective epitaxial growth (SEG) process, a chemical vapor deposition (CVD) process (e.g., a vapor-phase epitaxy (VPE) process, a low-pressure CVD (LPCVD) process, and/or an ultra-high vacuum CVD (UHV-CVD) process), a molecular beam epitaxy process, another applicable process, or a combination thereof.

Afterwards, a photoresist layer may be formed over the nanosheet stack 104 (not shown). The photoresist layer may be patterned by a patterning process including a photolithography process and an etching process. The photolithography process may include photoresist coating (e.g., spin-on coating), soft baking, mask aligning, exposure, post-exposure baking, developing the photoresist, rinsing and drying (e.g., hard baking). The etching process may include a dry etching process or a wet etching process.

Next, after the photoresist layer is patterned, the nanosheet stack 104 and the upper portion of the substrate 102 are patterned by using the patterned photoresist layer as a mask as shown in FIGS. 2B-1 and 2B-3 in accordance with some embodiments. As a result, a patterned nanosheet stack 104 and a patterned substrate 102 may be obtained. Afterwards, the patterned photoresist layer may be removed.

Next, an isolation layer 110 is formed to cover the nanosheet stack 104 and the substrate 102, as shown in FIGS. 2B-1 and 2B-3 in accordance with some embodiments. The isolation layer 110 may be made of silicon oxide, silicon nitride, silicon oxynitride, fluoride-doped silicate glass (FSG), or another low-k dielectric material. The isolation layer 110 may be deposited by a deposition process, such as a chemical vapor deposition (CVD) process, a spin-on-glass process, or another applicable process.

Figures 1, 2A:
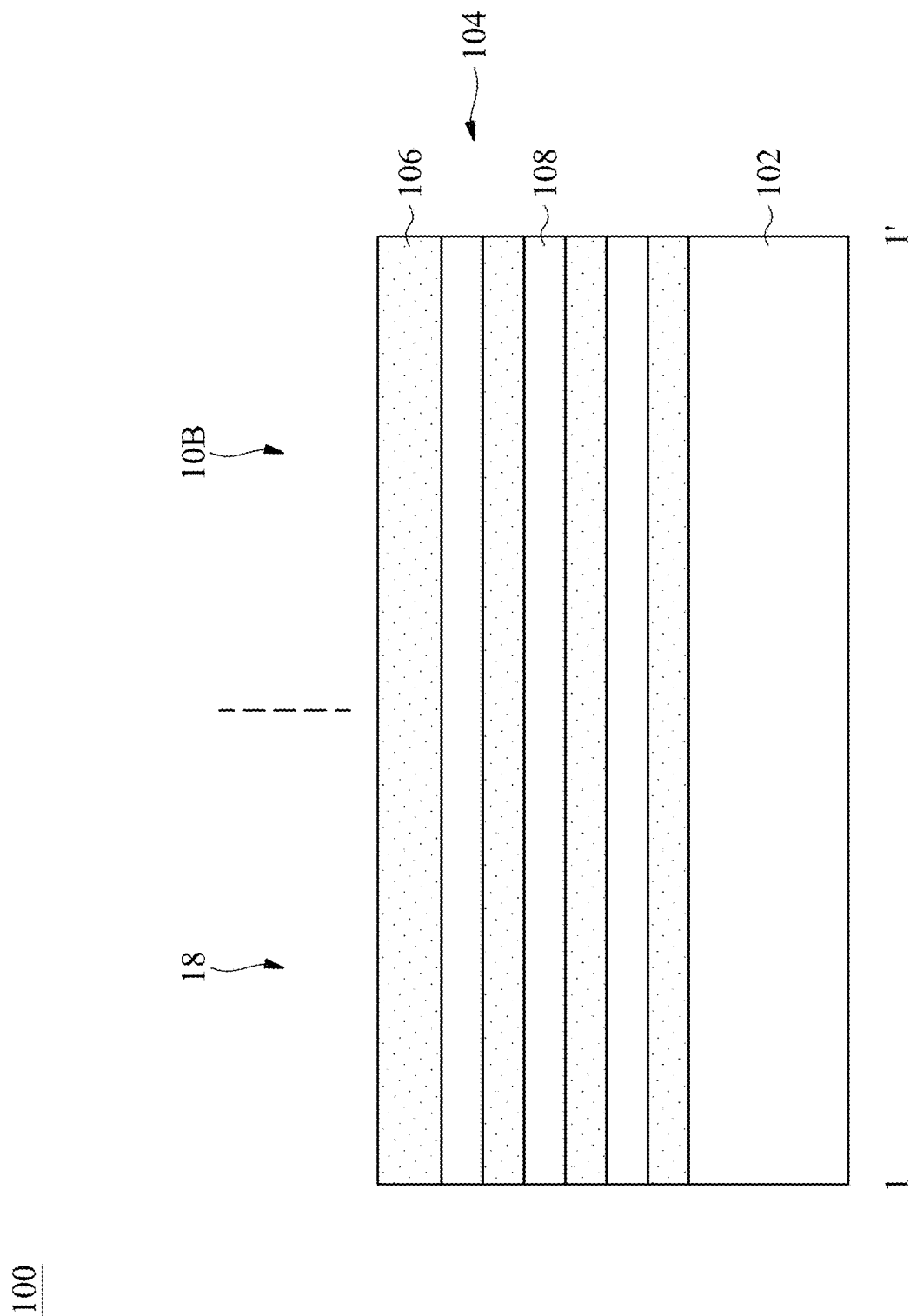
Figures 2, 2A:
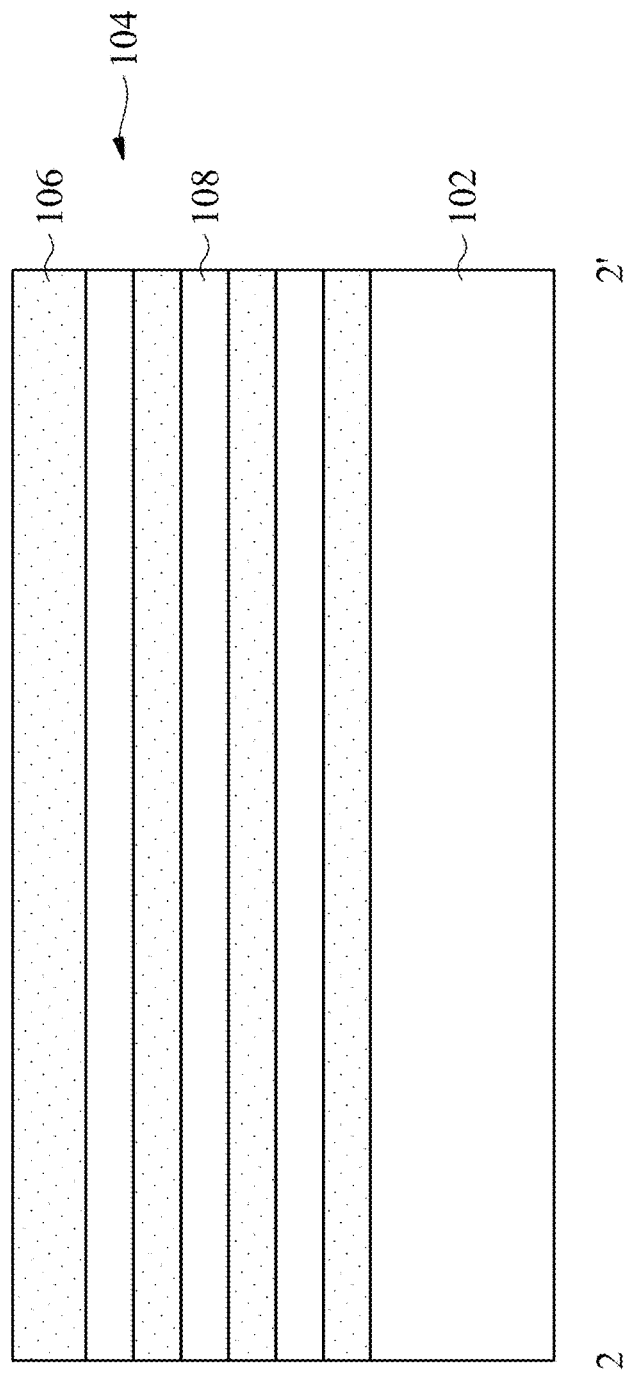
Figures 2, 2A, 3:
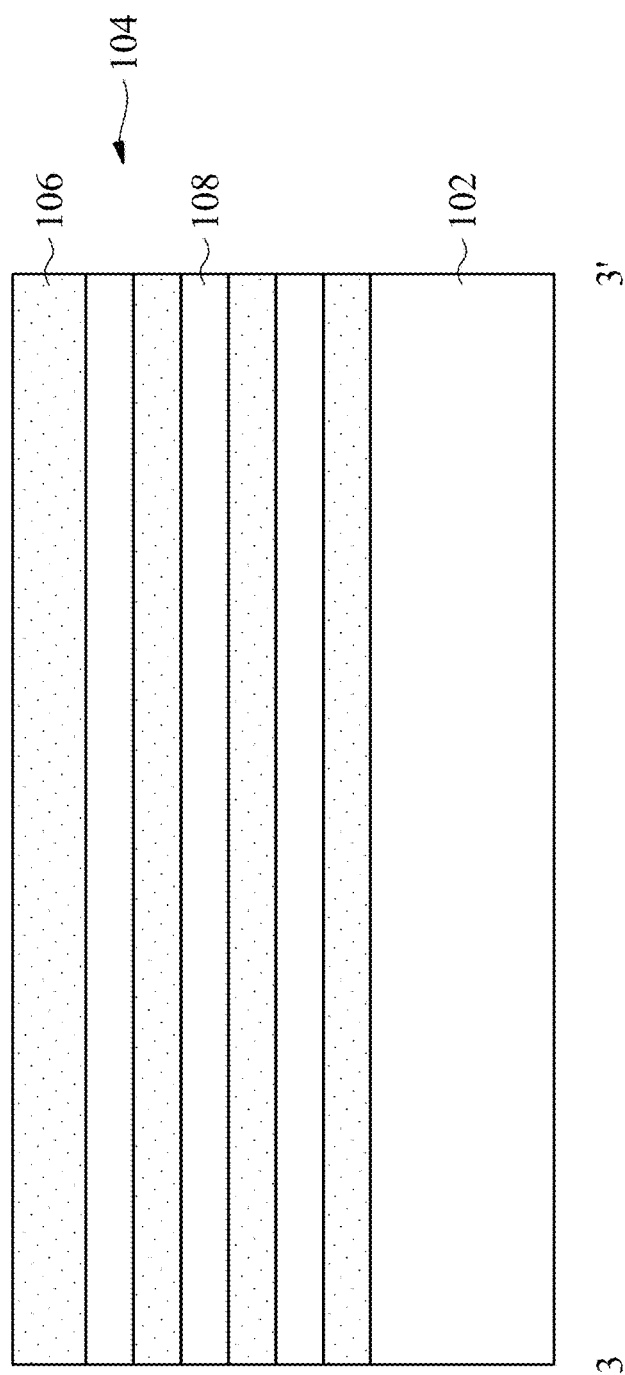
Figures 1, 2B:
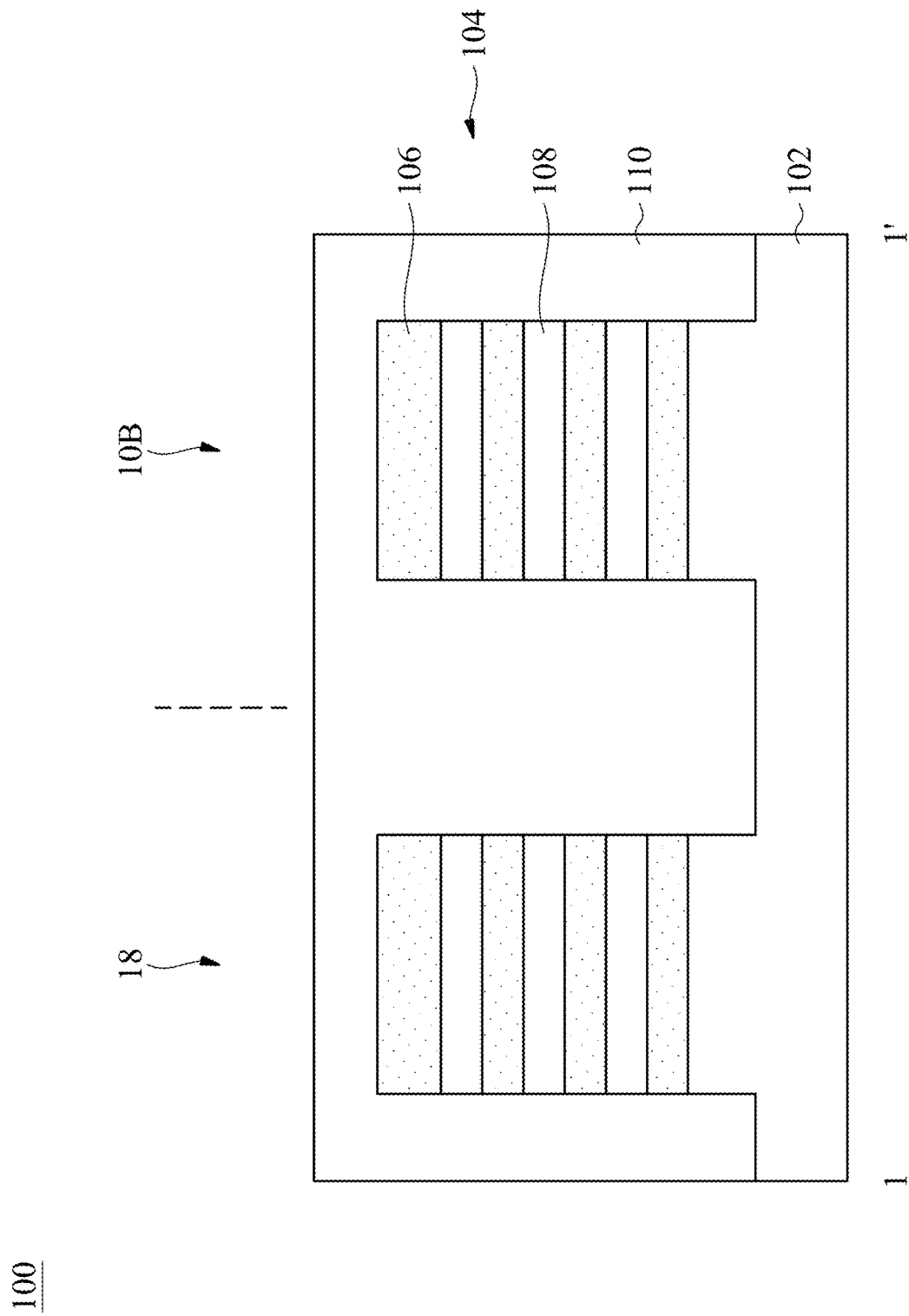
Figures 2, 2B:
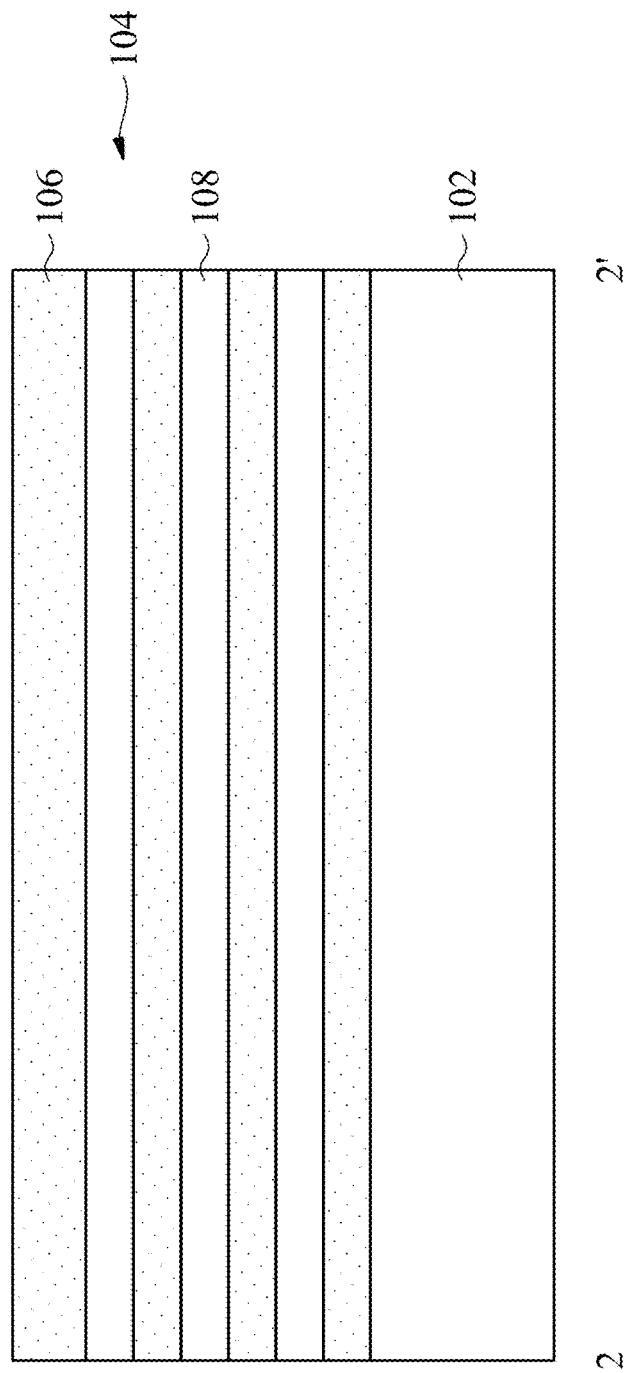
Figures 2, 2B, 3:
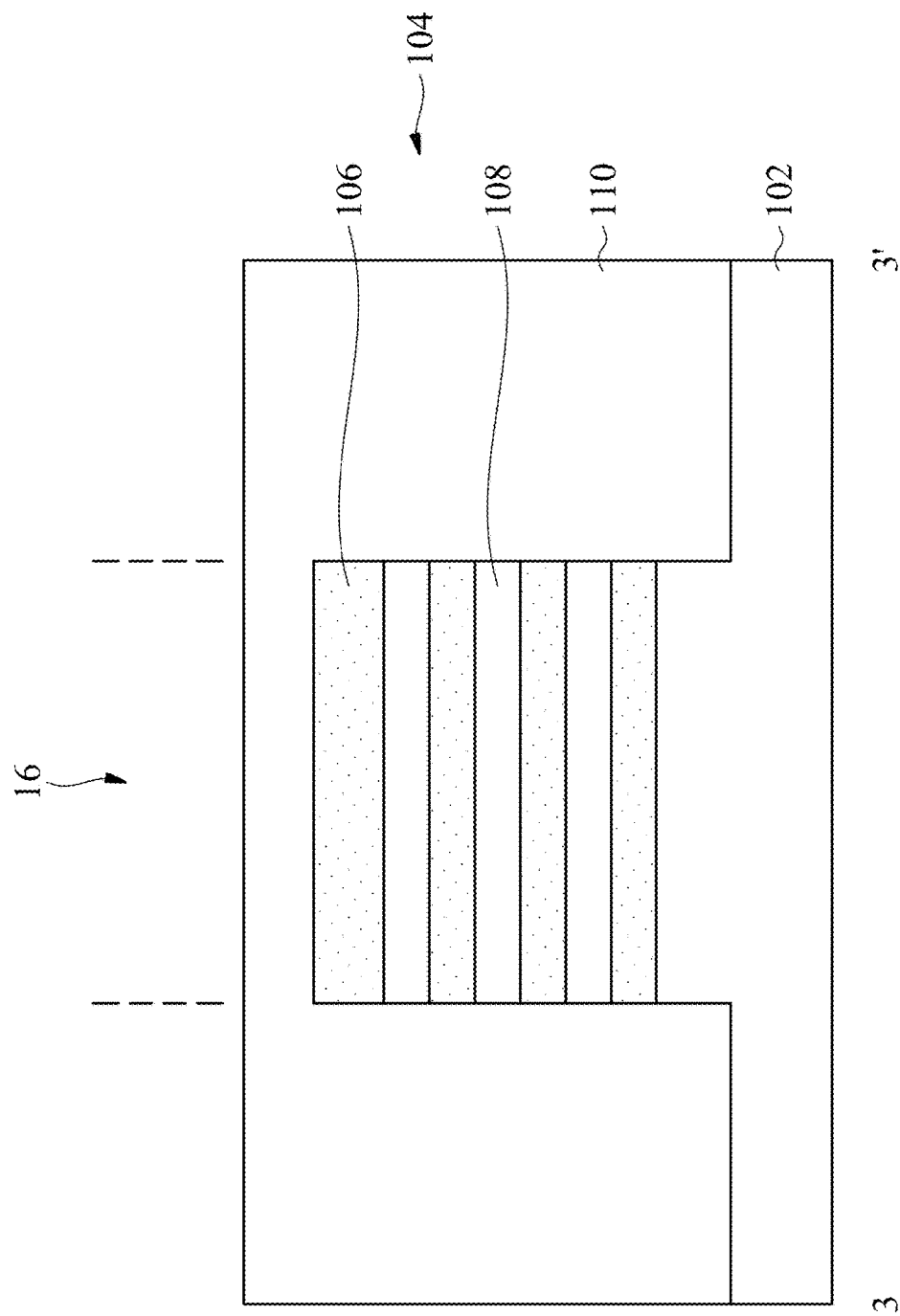

As shown in FIGS. 1 and 2B-1 in accordance with some embodiments, after the nanosheet stack 104 is patterned, separate nanosheet stacks 104 are formed in the source/drain region 18 in the device region 10D and the boundary region 10B respectively. The nanosheet stack 104 may be separated by the isolation layer 110.

Afterwards, in some embodiments, the isolation layer 110 is planarized to expose the top surface of the nanosheet stack 104 (not shown). In some embodiments, the isolation layer 110 may be planarized by a chemical mechanical polishing (CMP) process.

Figures 2, 2C:
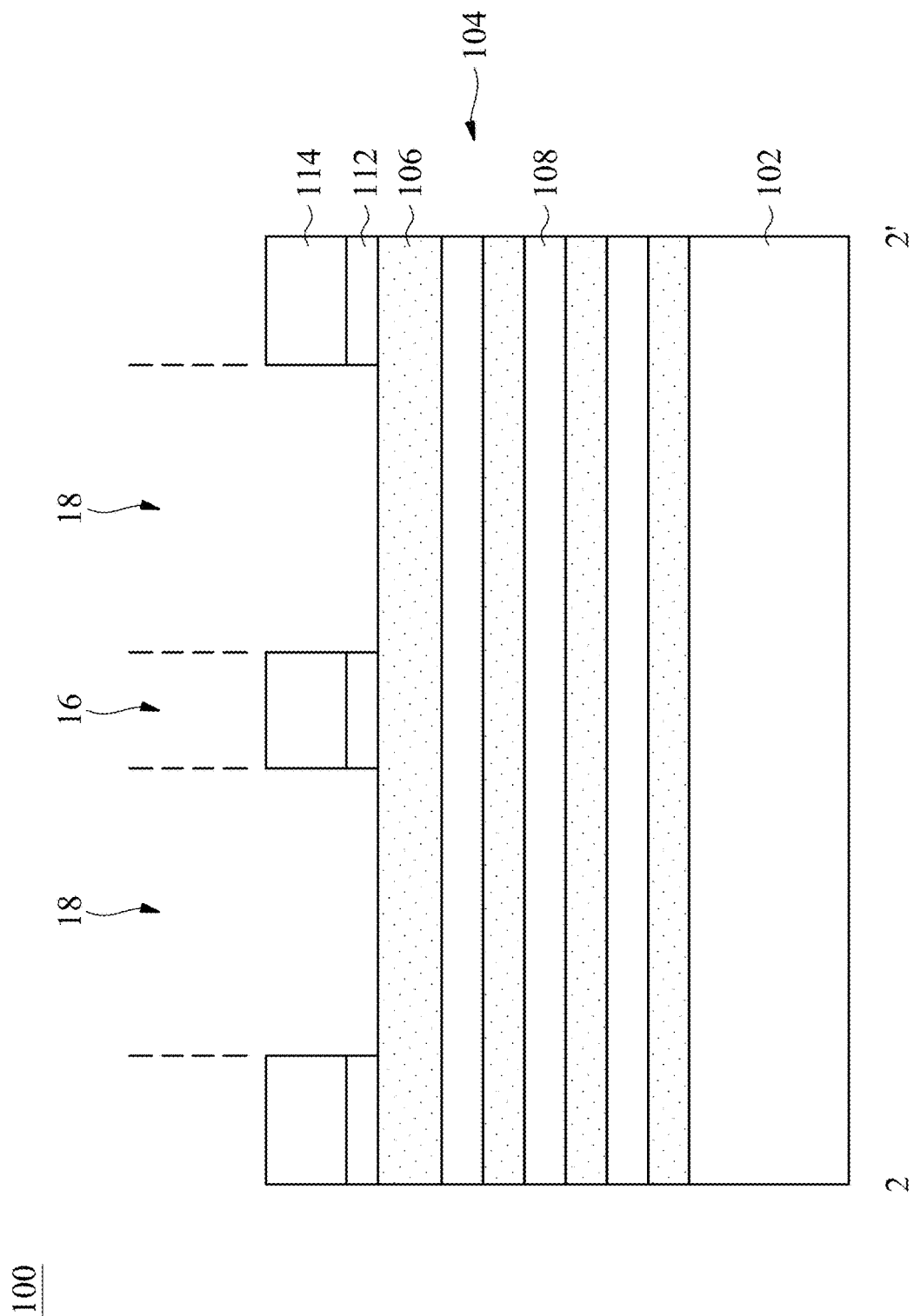
Figures 2, 2C, 3:
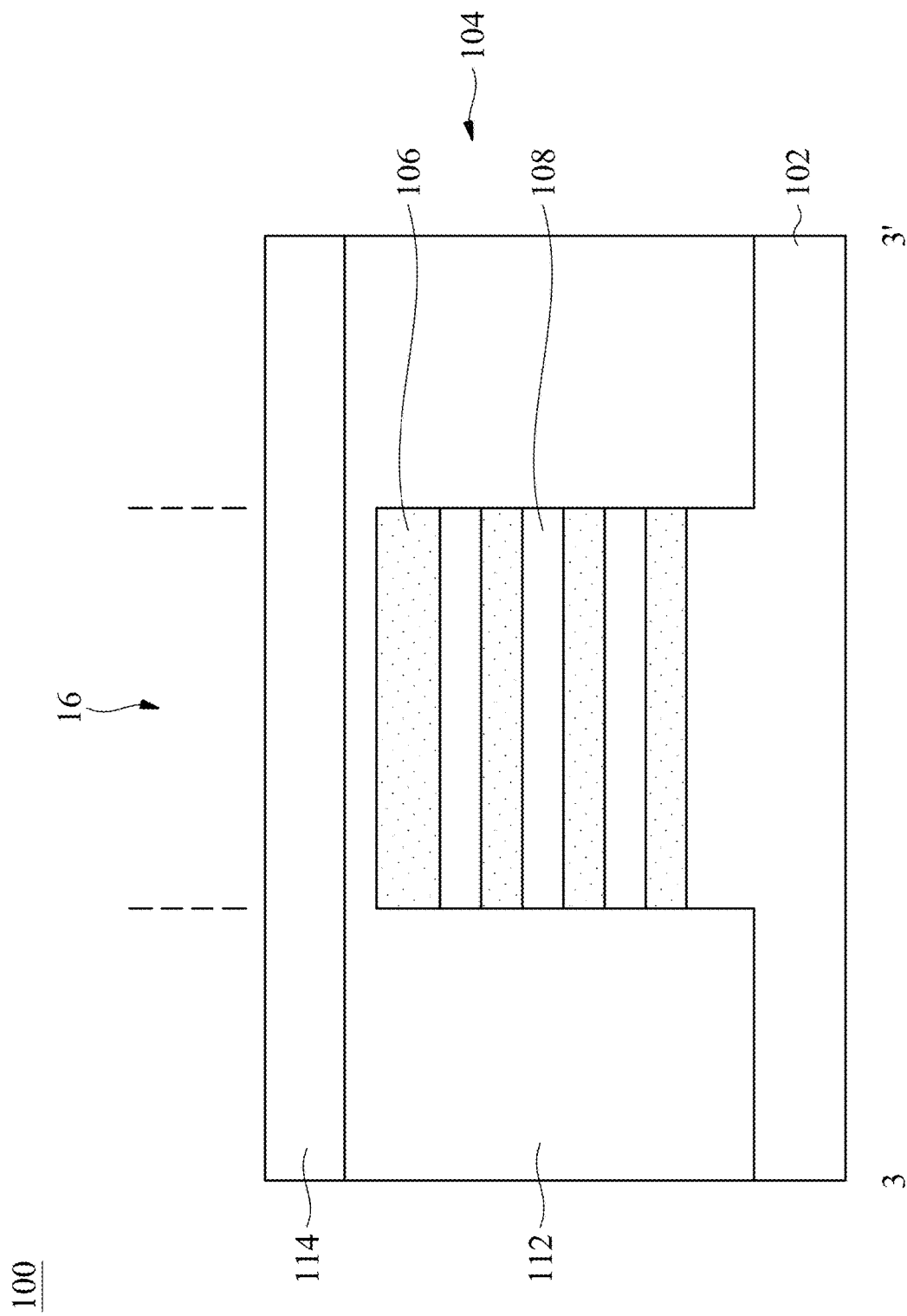

Next, an etching process is performed on the isolation layer 110, as shown in FIGS. 2C-1 and 2C-3 in accordance with some embodiments. In some embodiments, the isolation layer 110 is completely removed. Therefore, the nanosheet stack 104 and the substrate 102 are exposed, as shown in FIGS. 2C-1. In some embodiments, a portion of the isolation layer 110 is removed. As a result, the nanosheet stack 104 may be exposed and the remaining isolation layer 110 may surround the top portion of the substrate 102. The remaining isolation layer 110 may be an isolation structure such as a shallow trench isolation (STI) structure surrounding the top portion of the substrate 102. The isolation structure may be configured to prevent electrical interference or crosstalk.

Afterwards, a dummy gate layer 112 is formed over the top surface and the sidewalls of the nanosheet stack 104 as shown in FIGS. 2C-2 and 2C-3 in accordance with some embodiments. The dummy gate layer 112 may define a channel region 16 and a source/drain region 18. As shown in FIG. 2C-2 in accordance with some embodiments, the channel region 16 is directly under the dummy gate layer 112, and the source/drain region 18 is on the opposite side of the channel region 16 and is not covered by the dummy gate layer 112.

The dummy gate layer 112 may include a dummy dielectric layer and a dummy gate electrode layer (not shown). The dummy dielectric layer may be first conformally formed over the nanosheet stack 104. The dummy dielectric layer may be made of dielectric materials, such as silicon oxide, silicon nitride, silicon oxynitride, dielectric material(s) with high dielectric constant (high-k), or a combination thereof. The dummy dielectric layer may be formed by a deposition process, such as chemical vapor deposition (CVD), physical vapor deposition (PVD), atomic layer deposition (ALD), high density plasma CVD (HDPCVD), metal organic CVD (MOCVD), or plasma enhanced CVD (PECVD).

After forming the dummy dielectric layer, the dummy gate electrode layer may be conformally formed over the dummy dielectric layer. The dummy gate electrode layer may be made of polysilicon. The dummy gate electrode layer may be formed by a deposition process, such as chemical vapor deposition (CVD), physical vapor deposition (PVD), atomic layer deposition (ALD), high density plasma CVD (HDPCVD), metal organic CVD (MOCVD), or plasma enhanced CVD (PECVD).

Afterwards, as shown in FIGS. 2C-1, 2C-2 and 2C-3 in accordance with some embodiments, an etching process is performed on the dummy gate layer 112 to form a dummy gate structure 112 by using a patterned hard mask layer 114. The dummy gate layer 112 may be partially removed in the etching process. The etching process may be a dry etching process or a wet etching process. In some embodiments, the dummy dielectric layer and the dummy gate electrode layer are etched by a dry etching process. The dry etching process may include using a fluorine-based etchant gas, such as $SF_6$, $C_xF_y$ (where x and y may be positive integers), $NF_3$, or a combination thereof. After the etching process, the nanosheet stack 104 is exposed in the source/drain region 18 and the boundary region 10B, as shown in FIGS. 2C-1 and 2C-2.

Figures 1, 2D:
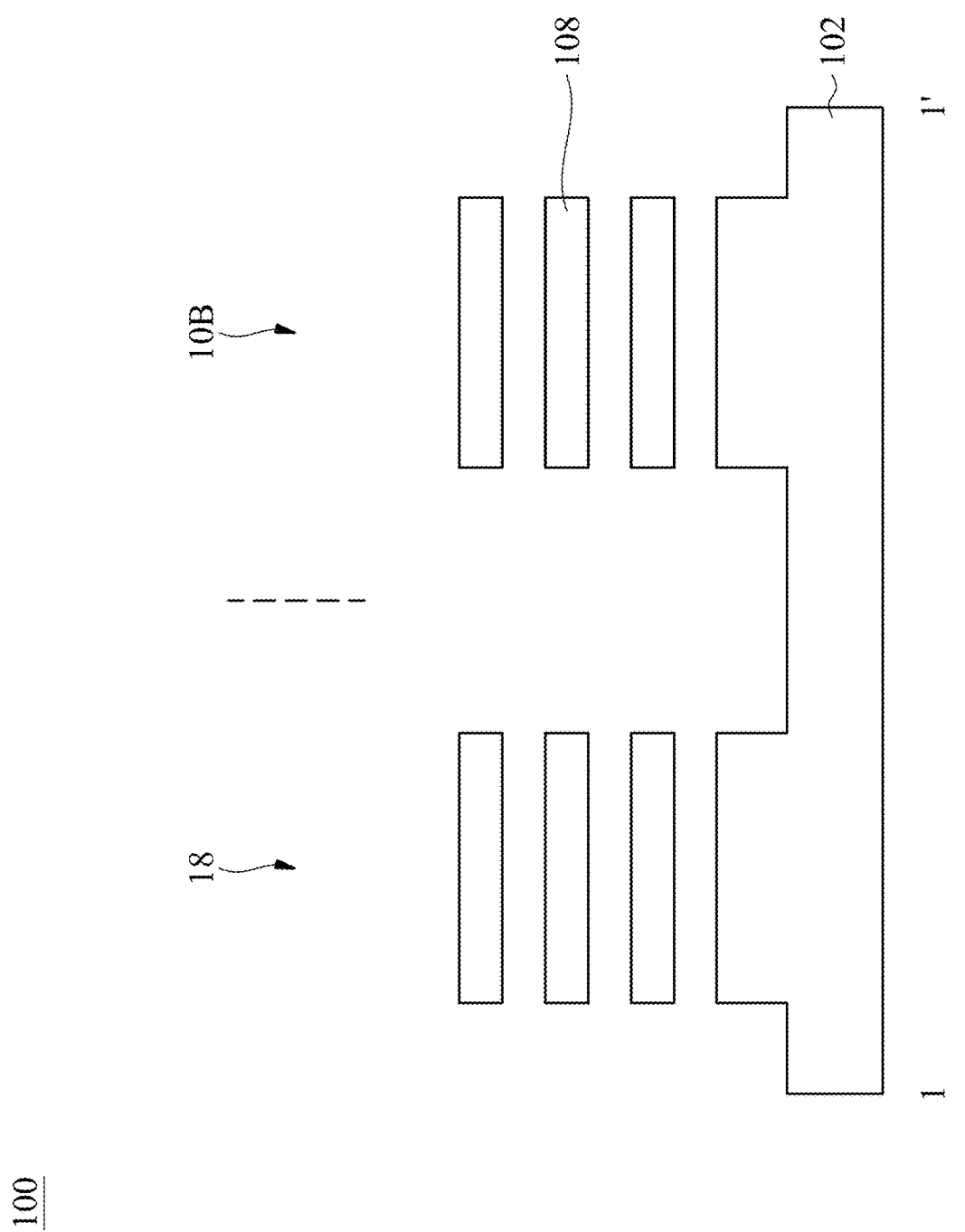
Figures 2, 2D:
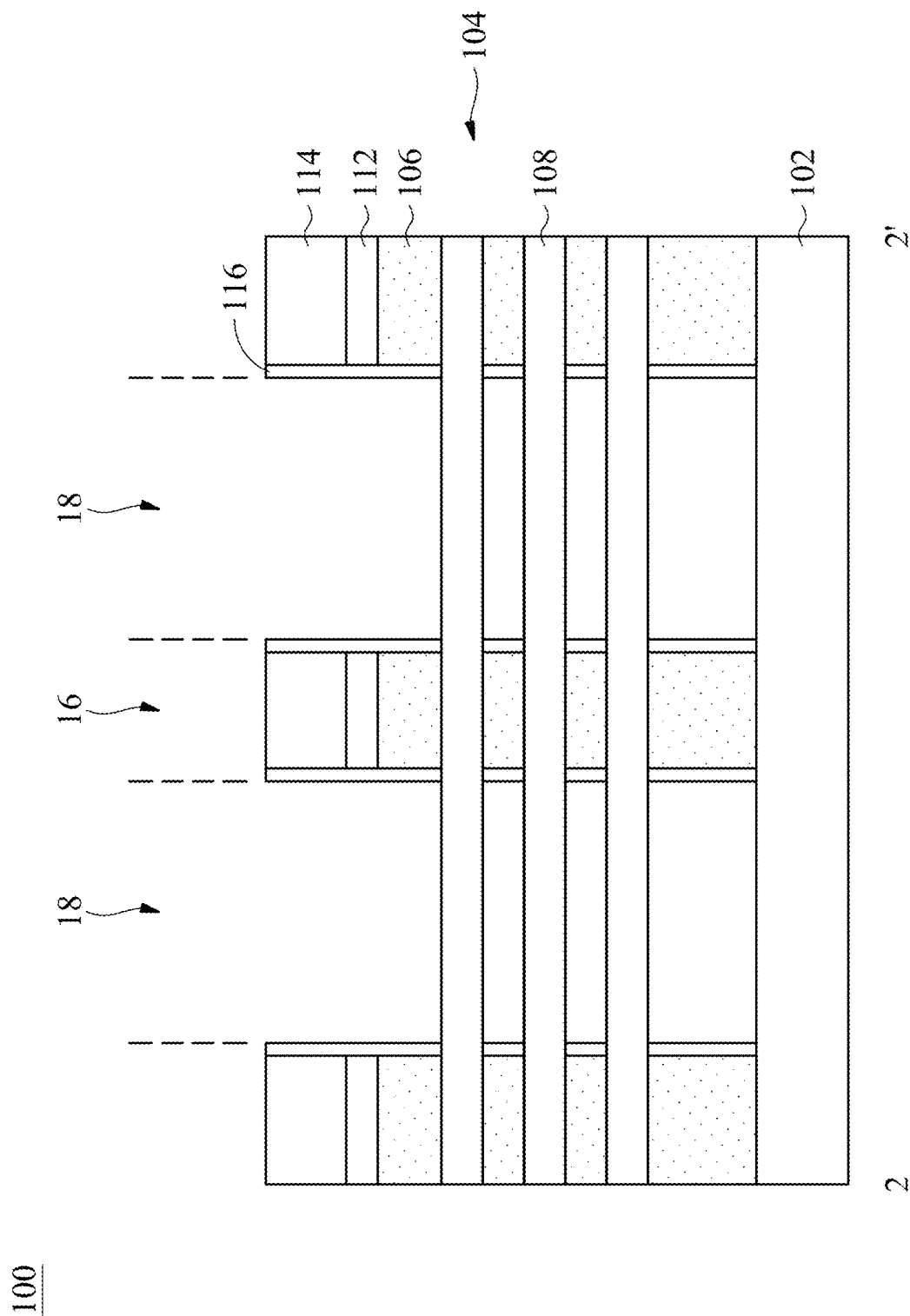
Figures 2, 2D, 3:
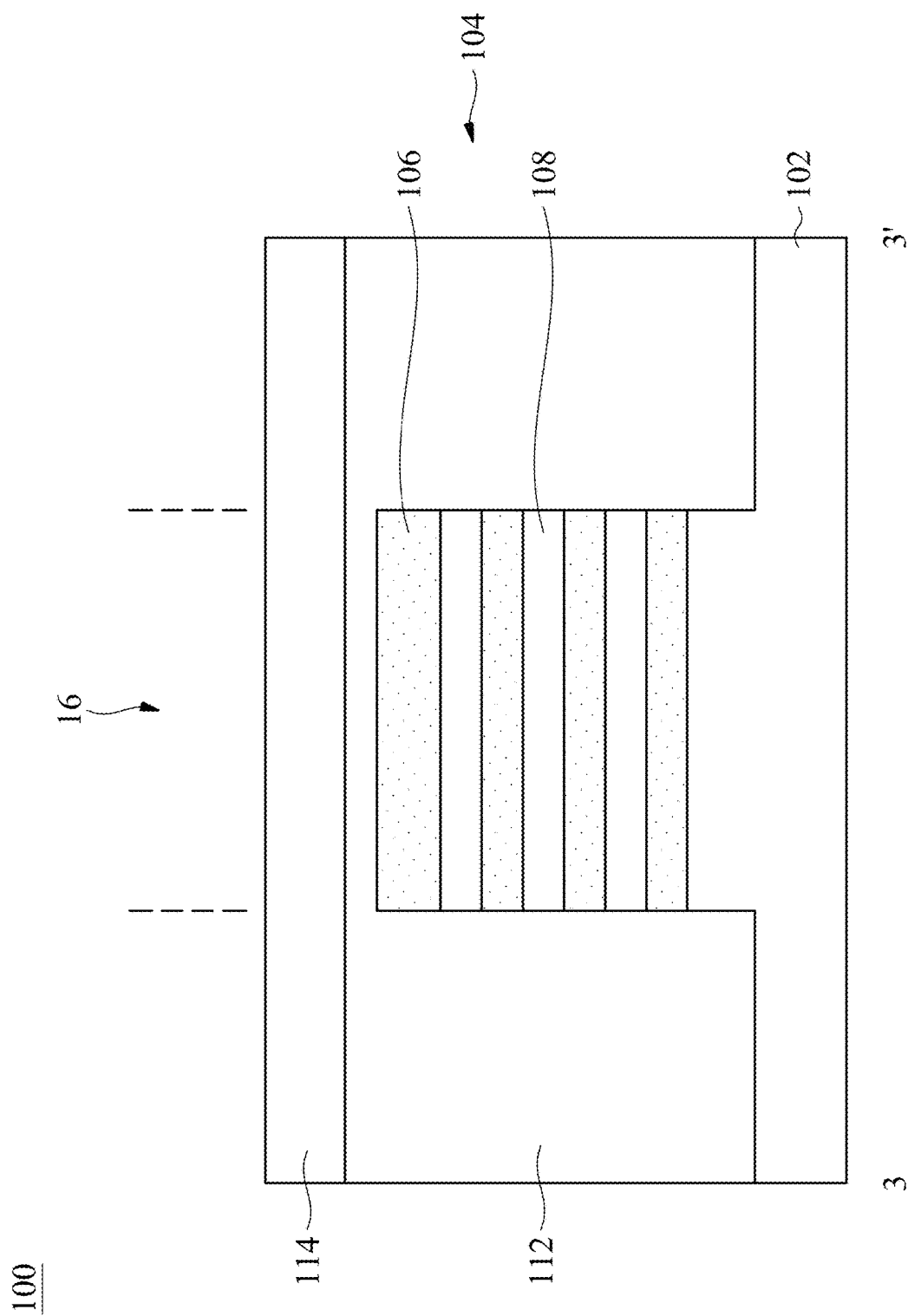

Next, the first semiconductor layers 106 in the source/drain region 18 are removed, and a pair of spacers 116 are formed on sidewalls of the dummy gate layer 112, as shown in FIGS. 2D-1 and 2D-2 in accordance with some embodiments. The first semiconductor layers 106 in the source/drain region 18 may be removed by a dry etching process, such as an anisotropic etching process. The spacers 116 may be made of silicon oxide, silicon nitride, silicon oxynitride, and/or dielectric materials. The spacers 116 may be formed by a chemical vapor deposition (CVD) process, a spin-on-glass process, or other applicable processes. In some embodiments, the spacers 116 also fill in the gap between the first semiconductor layers 106 in the source/drain region 18 (not shown).

Figures 1, 2E:
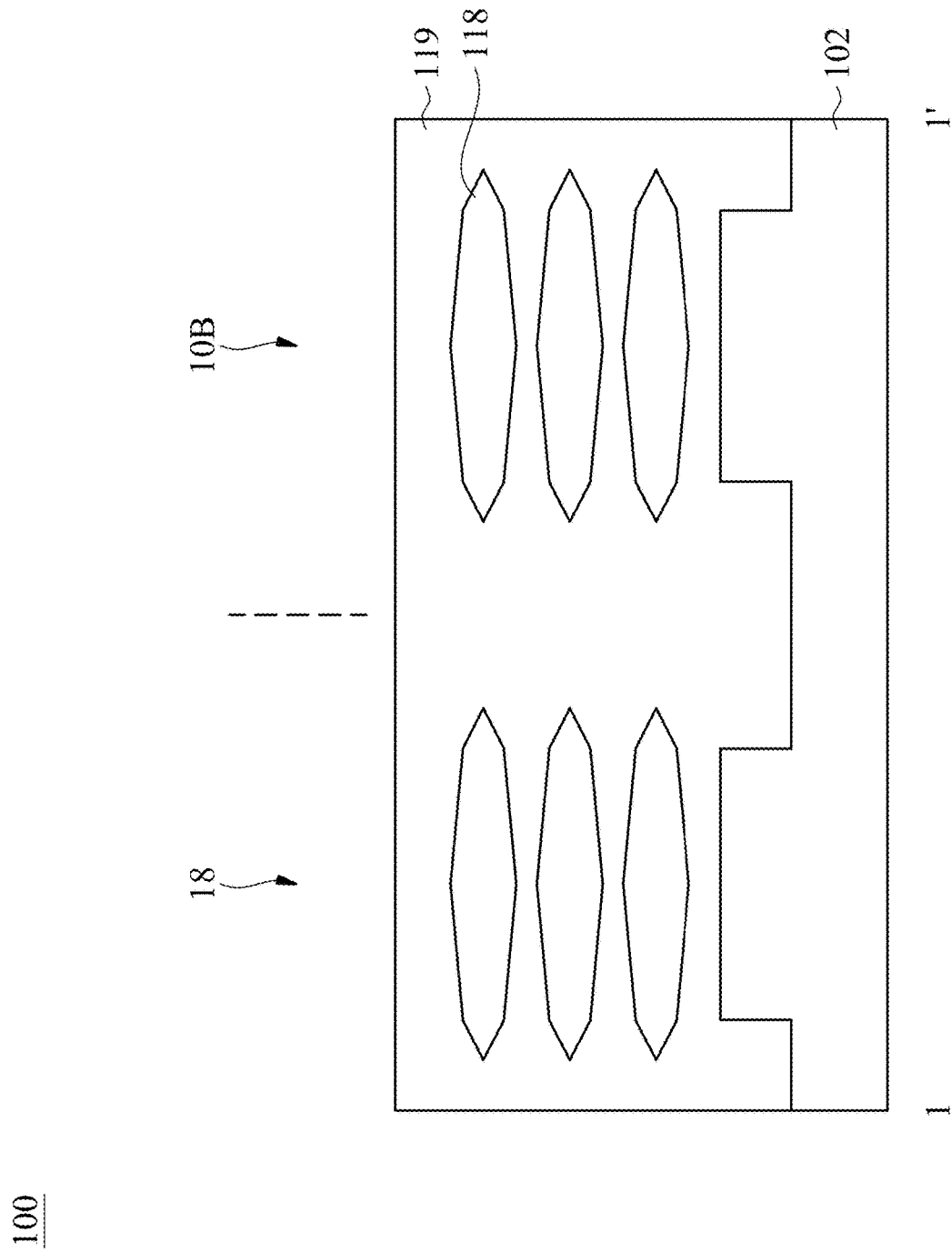
Figures 2, 2E:
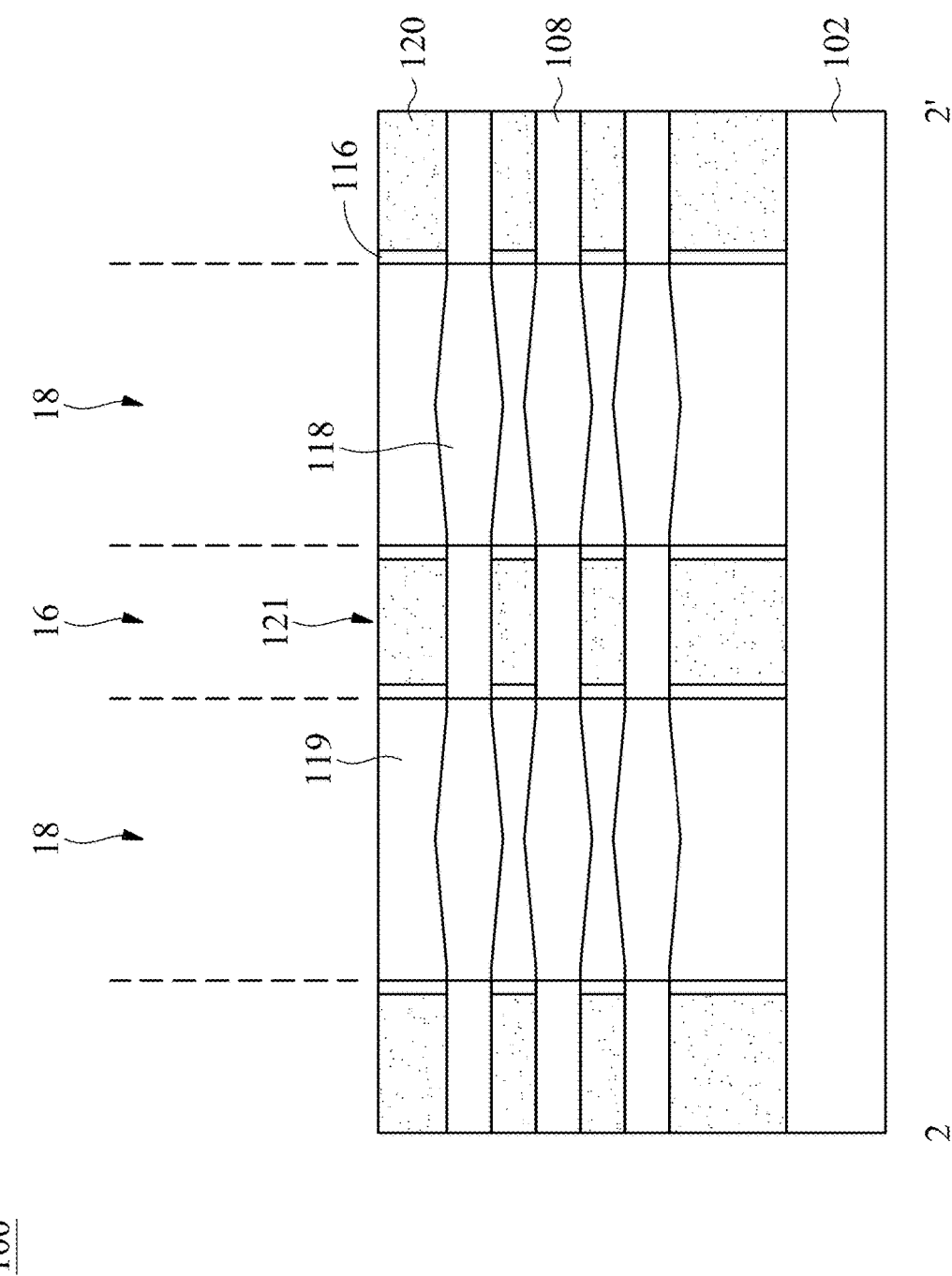
Figures 2, 2E, 3:
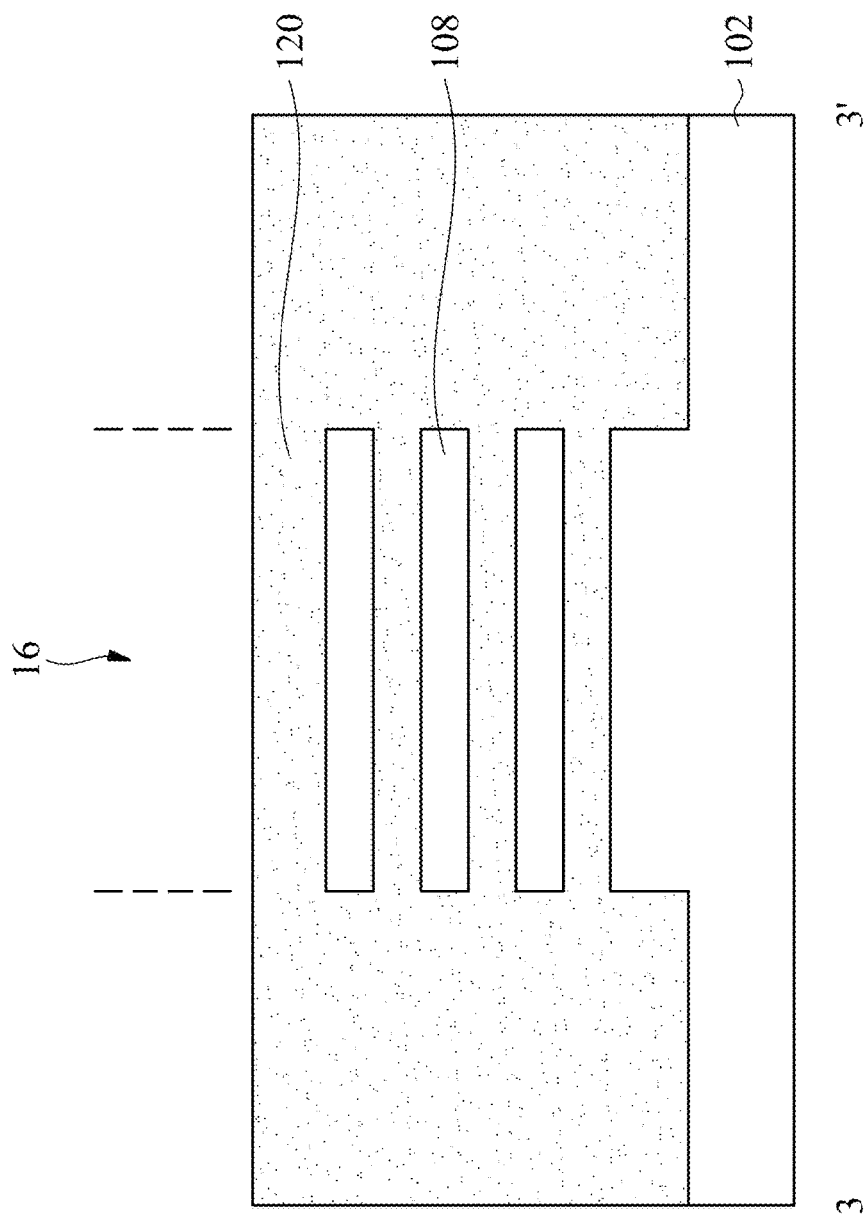

Next, epitaxial structures 118 are formed in the source/drain region 18 and the boundary region 10B, as shown in FIGS. 2E-1 and 2E-2 in accordance with some embodiments. In some embodiments, the second semiconductor layers 108 in the source/drain region 18 are removed, and a strained material is grown by an epitaxial (epi) process to form the epitaxial structures 118 in the source/drain region 18 and the boundary region 10B. In addition, the lattice constant of the strained material may be different from the lattice constant of the substrate 102. In some embodiments, the second semiconductor layers 108 in the source/drain region 18 are not removed, and the strained material is grown cladding around the second semiconductor layers 108 in the source/drain region 18 and the boundary region 10B. The type of the strained material in the present disclosure is not limited, depending on the needs of mobility or resistance improvement. In some embodiments as shown in FIGS. 2E-1 and 2E-2, the epitaxial structures 118 include vertically arranged epitaxial layers.

The epitaxial structures 118 may include Ge, SiGe, InAs, InGaAs, InSb, GaAs, GaSb, InAlP, InP, SiC, SiP, other applicable materials, or a combination thereof. The epitaxial structures 118 may be formed by an epitaxial growth step, such as metalorganic chemical vapor deposition (MOCVD), metalorganic vapor phase epitaxy (MOVPE), plasma-enhanced chemical vapor deposition (PECVD), remote plasma-enhanced chemical vapor deposition (RP-CVD), molecular beam epitaxy (MBE), hydride vapor phase epitaxy (HVPE), liquid phase epitaxy (LPE), chloride vapor phase epitaxy (Cl-VPE), or any other suitable method.

After the epitaxial structure 118 is formed, an inter-layer dielectric (ILD) structure 119 is formed to cover the epitaxial structure 118 as shown in FIGS. 2E-1 and 2E-2 in accordance with some embodiments. The inter-layer dielectric structure 119 may include multilayers made of multiple dielectric materials, such as silicon oxide, silicon nitride, silicon oxynitride, phosphosilicate glass (PSG), borophosphosilicate glass (BPSG), low-k dielectric material, and/or other applicable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide. The inter-layer dielectric structure 119 may be formed by chemical vapor deposition (CVD), spin-on coating, or other applicable processes.

Afterwards, a planarizing process is performed on the inter-layer dielectric structure 119 until the top surface of the dummy gate layer 112 is exposed in accordance with some embodiments (not shown). After the planarizing process, the top surface of the dummy gate layer 112 may be substantially level with the top surfaces of the spacers 116 and the inter-layer dielectric structure 119. The planarizing process may include a grinding process, a chemical mechanical polishing (CMP) process, an etching process, another applicable process, or a combination thereof.

Next, the dummy gate layer 112 in the channel region 16 is removed, as shown in FIGS. 2E-2 and 2E-3 in accordance with some embodiments. Therefore, the first semiconductor layer 106 and the second semiconductor layer 108 in the channel region 16 may be exposed. The dummy gate layer 112 may be removed by an etching process, such as a dry etching process or a wet etching process.

After removing the dummy gate layer 112 in the channel region 16, the first semiconductor 106 in the channel region 16 is removed, as shown in FIGS. 2E-2 and 2E-3 in accordance with some embodiments. The second semiconductor layers 108 are left in the channel region 16. The first semiconductor 106 in the channel region 16 may be removed by an etching process, such as an anisotropic etching process.

Next, a gate stack 120 is formed surrounding the second semiconductor layers 108 in the channel region 16, as shown in FIGS. 2E-2 and 2E-3 in accordance with some embodiments. In some embodiments, the gate stack 120 fills in the space between the second semiconductor layers 108 in the channel region 16. The gate stack 120 may include a gate dielectric layer, a work function layer, and a gate electrode layer (not shown). After forming the gate stack 120, the gate structure 121 in the channel region 16 includes vertically arranged second semiconductor layers 108 surrounded by the gate stack 120 as shown in FIGS. 2E-2 and 2E-3 in accordance with some embodiments.

The gate dielectric layer may include a high-k dielectric layer (e.g., the dielectric constant is greater than 3.9) such as hafnium oxide ($HfO_2$). The high-k dielectric layer may include other high-k dielectrics such as LaO, AlO, ZrO, TiO, $Ta_2O_5$, $Y_2O_3$, $SrTiO_3$, $BaTiO_3$, BaZrO, HfZrO, HfLaO, HfTaO, HfSiO, HfSiON, HfTiO, LaSiO, AlSiO, $BaTiO_3$, $SrTiO_3$, $Al_2O_3$, other applicable high-k dielectric materials, or a combination thereof. The gate dielectric layer may be formed by a chemical vapor deposition process (CVD) (e.g., a plasma enhanced chemical vapor deposition (PECVD) process, a metalorganic chemical vapor deposition (MOCVD) process, or a high density plasma chemical vapor deposition (HDPCVD)), an atomic layer deposition (ALD) process (e.g., a plasma enhanced atomic layer deposition (PEALD) process), a physical vapor deposition (PVD) process (e.g., a vacuum evaporation process, or a sputtering process), other applicable processes, or a combination thereof.

The work function metal layer may be formed surrounding the gate dielectric layer. The work function metal layer may provide the desired work function for transistors to enhance device performance including improved threshold voltage. The work function metal layer may be made of metal materials, and the metal materials may include N-work-function metal or P-work-function metal. For N-type transistors, N-work-function metal may include tungsten (W), copper (Cu), titanium (Ti), silver (Ag), aluminum (Al), titanium aluminum alloy (TiAl), titanium aluminum nitride (TiAlN), tantalum carbide (TaC), tantalum carbon nitride (TaCN), tantalum silicon nitride (TaSiN), manganese (Mn), zirconium (Zr), or a combination thereof. For P-type transistors, the P-work-function metal may include titanium nitride (TiN), tungsten nitride (WN), tantalum nitride (TaN), ruthenium (Ru) or a combination thereof.

The gate electrode layer is formed surrounding the work function metal layer. The gate electrode layer may be made of a conductive material, such as aluminum, copper, tungsten, titanium, tantulum, titanium nitride, tantalum nitride, nickel silicide, cobalt silicide, TaC, TaSiN, TaCN, TiAl, TiAlN, or other applicable materials. The gate electrode layer may be formed by a chemical vapor deposition process (e.g., a low pressure chemical vapor deposition process, or a plasma enhanced chemical vapor deposition process), a physical vapor deposition process (e.g., a vacuum evaporation process, or a sputtering process), other applicable processes, or a combination thereof.

Figures 1, 2F:
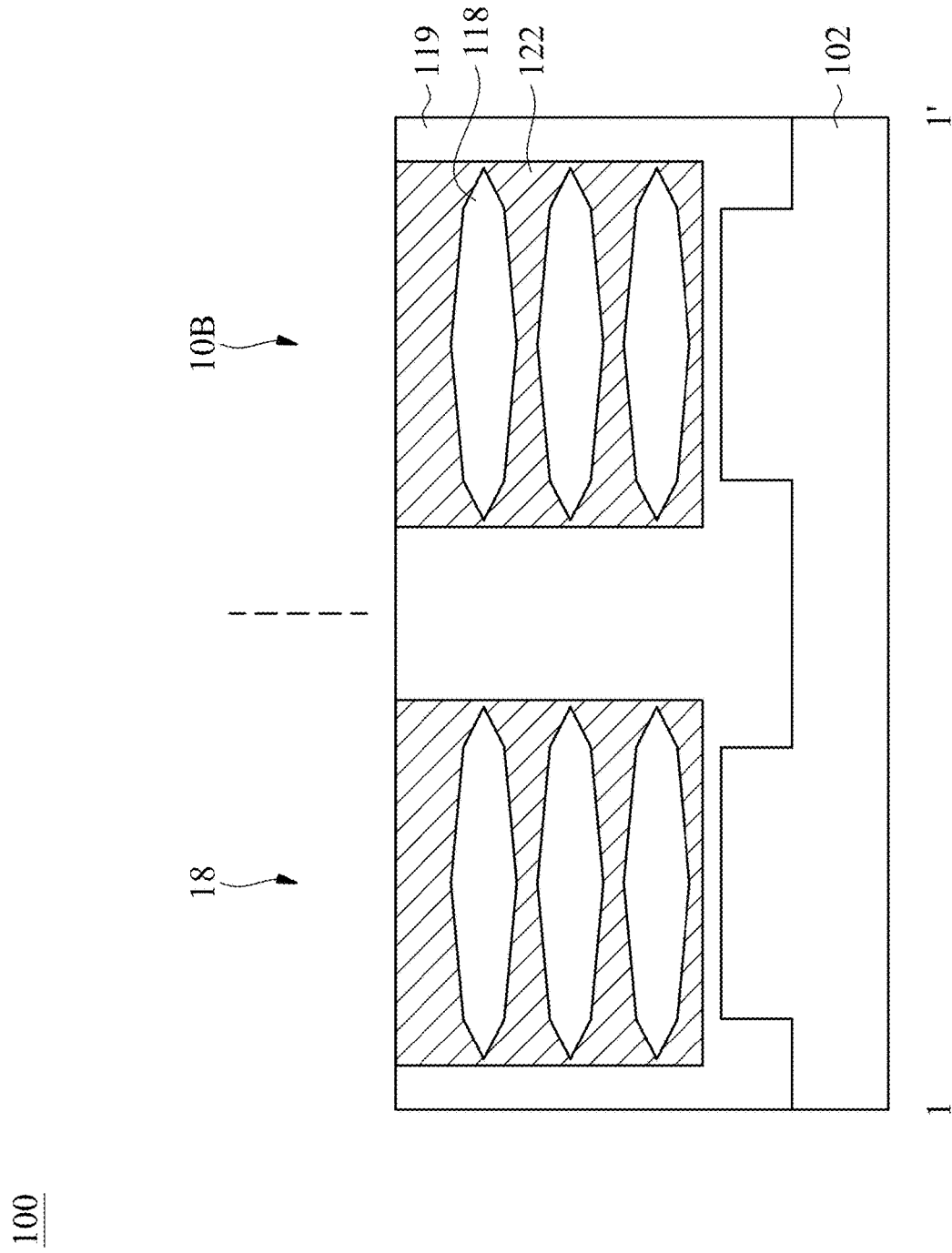
Figures 2, 2F:
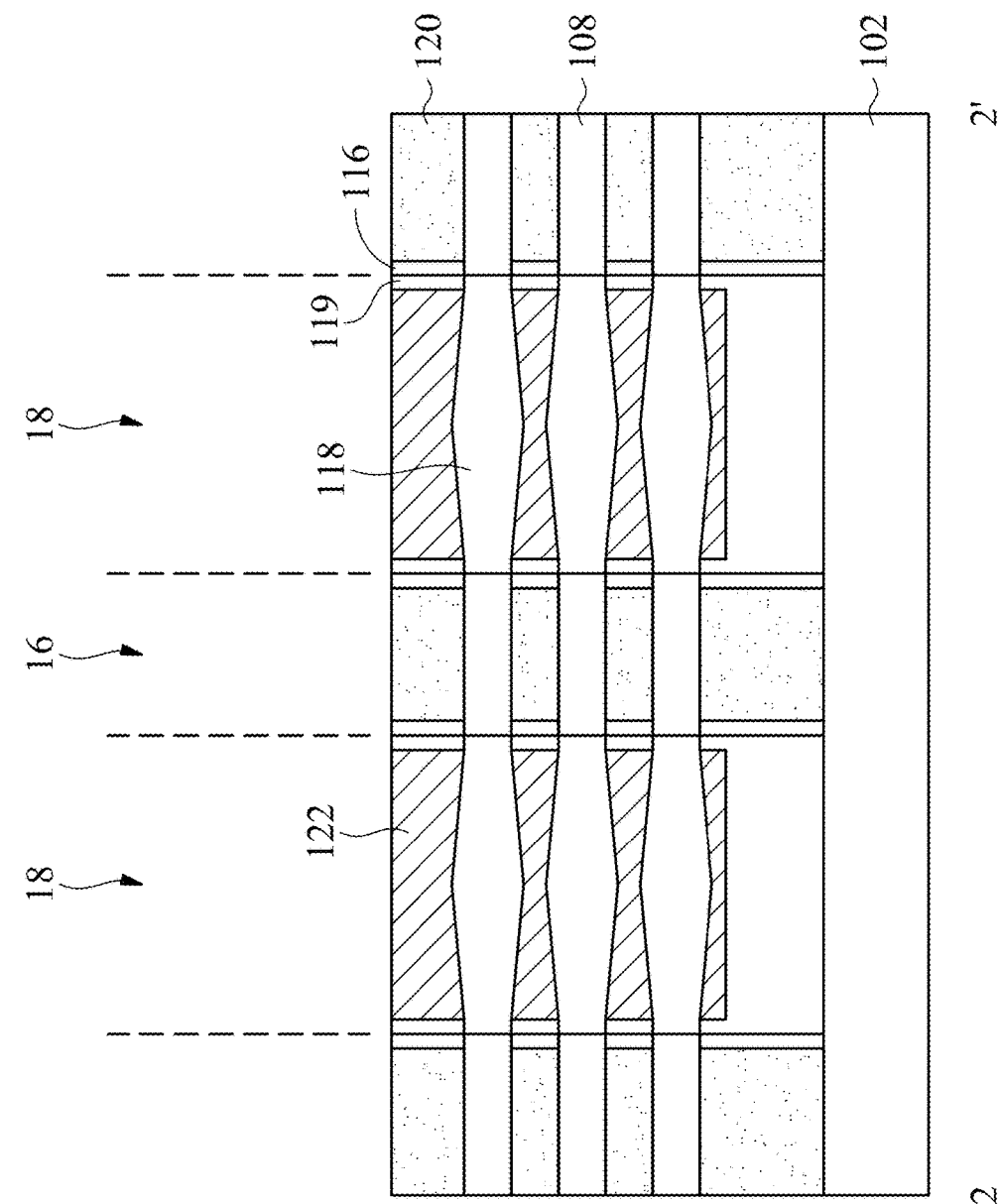
Figures 2, 2F, 3:
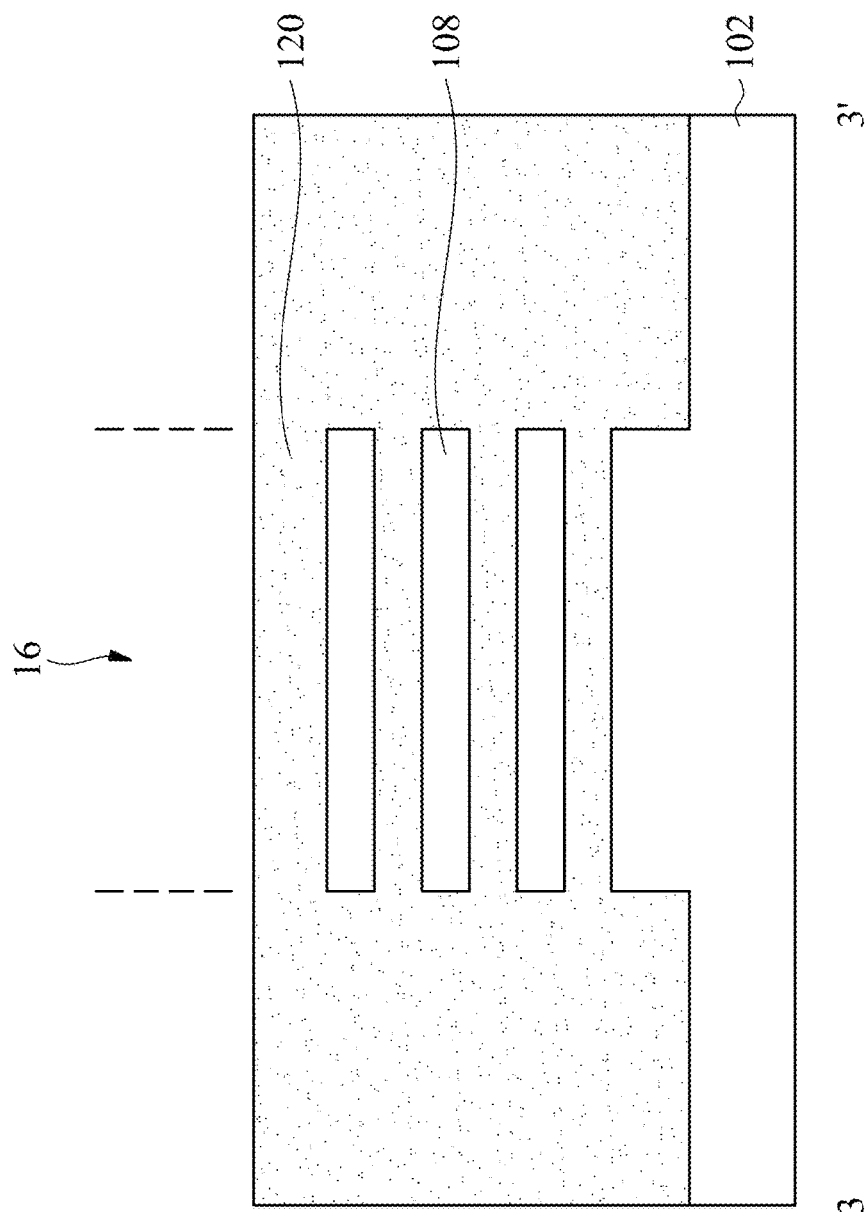

Next, a first contact structure 122 is formed surrounding the epitaxial structure 118 in the source/drain region 18 and in the boundary region 10B, as shown in FIGS. 2F-1 and 2F-2 in accordance with some embodiments. In some embodiments, the first contact structure 122 fills in the space between the vertically arranged epitaxial layers of the epitaxial structure 118. Therefore, the resistance of may be further reduced.

In some embodiments, openings are formed in the interlayer dielectric structure 119 (not shown), and a conductive material is filled in the openings to form the first contact structure 122. The first contact structure 122 may be made of metal materials (e.g., W, Al, or Cu), metal alloys, poly-Si, other applicable conductive materials, or a combination thereof. The first contact structure 122 may be formed by using a chemical vapor deposition process (CVD), a physical vapor deposition process (PVD, e.g., evaporation or sputter), an atomic layer deposition process (ALD), an electroplating process, another suitable process, or a combination thereof to deposit the conductive materials of the first contact structure 122 in the openings. A chemical mechanical polishing (CMP) process or an etching back process may be then optionally performed to remove excess conductive materials to form the first contact structure 122.

Figures 1, 2G:
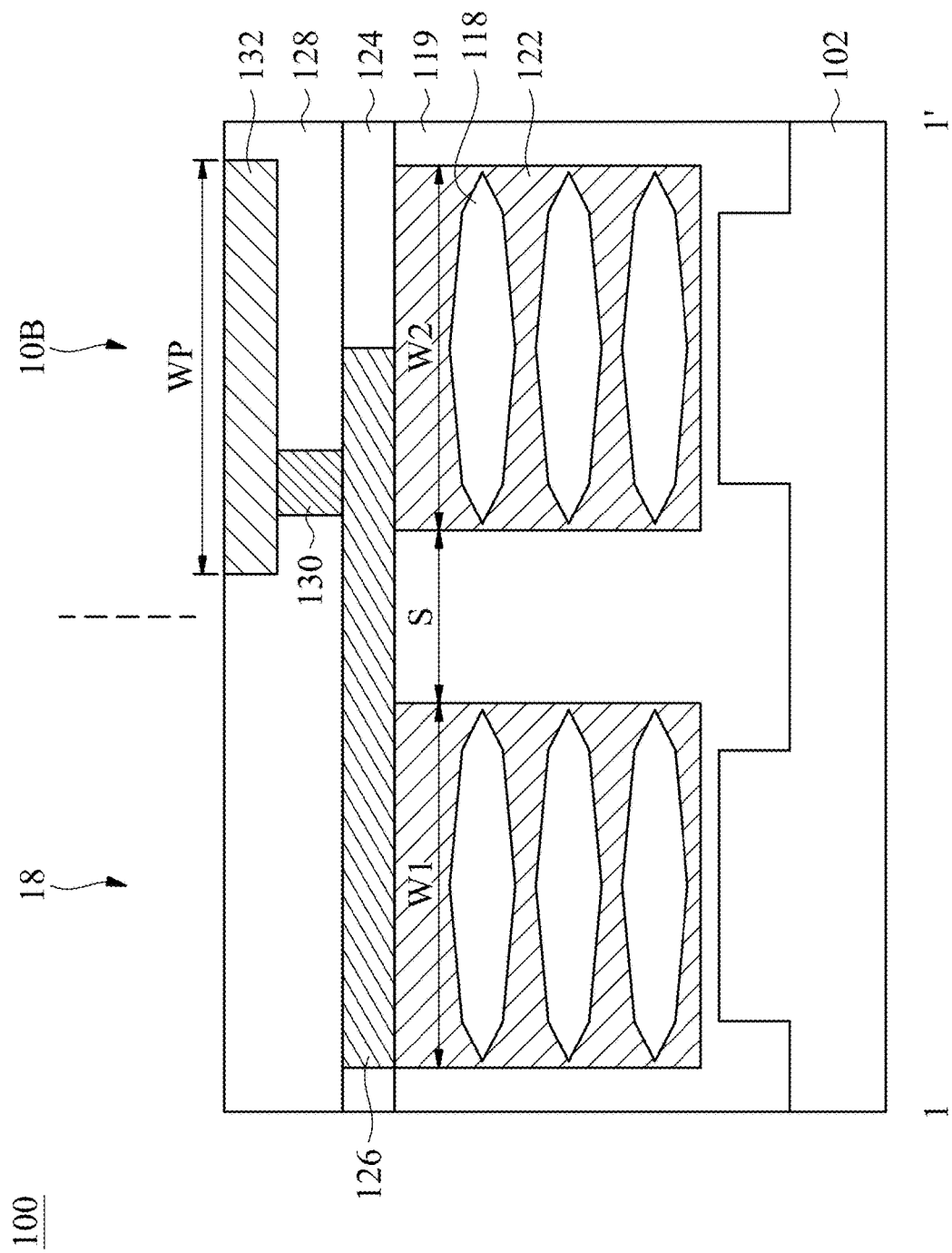
Figures 2, 2G:
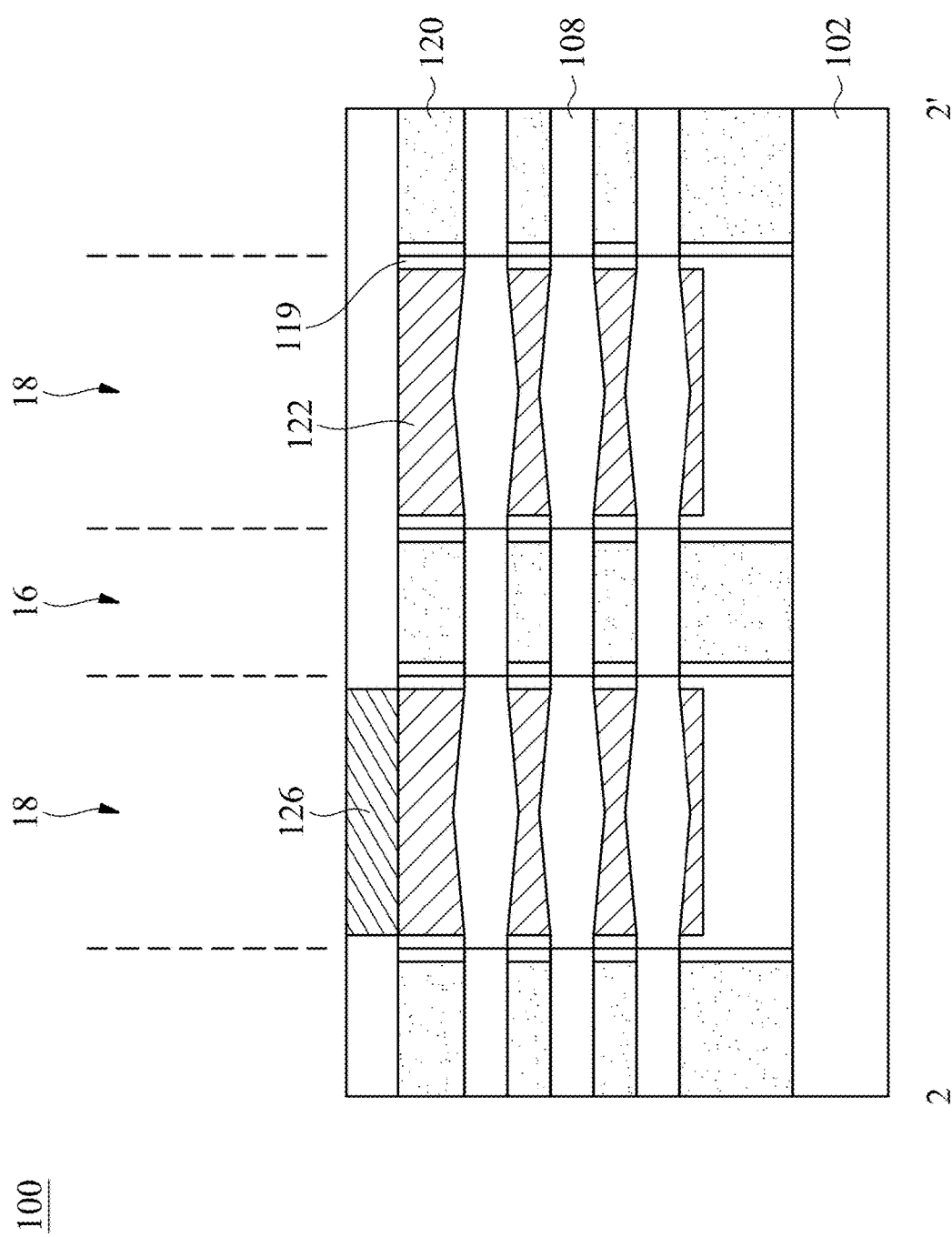
Figures 2, 2G, 3:
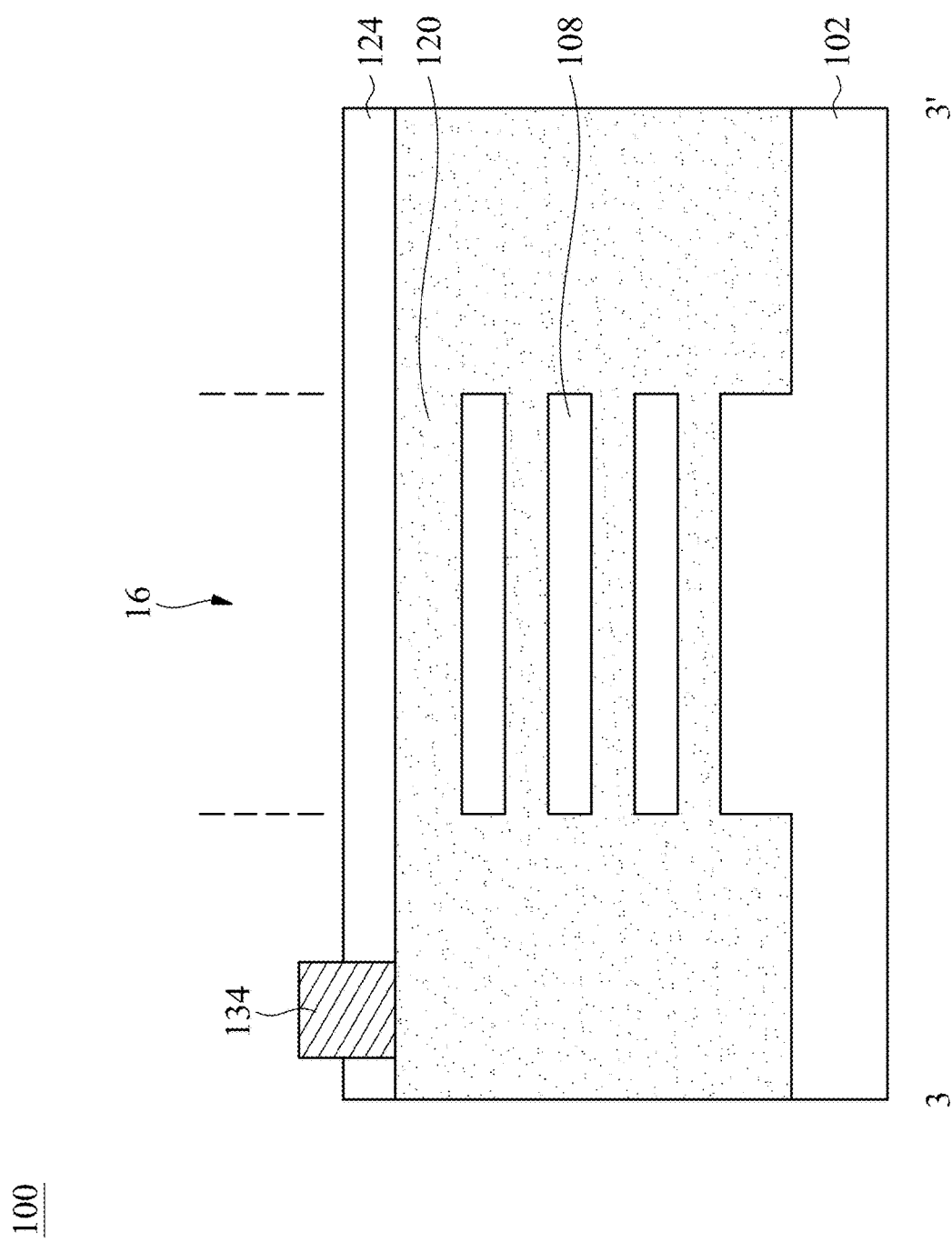

Next, a dielectric layer 124 is formed over the ILD structure 119 and a metal layer 126 is formed in the dielectric layer 124, as shown in FIGS. 2G-1 and 2G-2 in accordance with some embodiments. In some embodiments, the metal layer 126 is in direct contact with and electrically connected to the first contact structure 122 formed in the source/drain region 18 and in the boundary region 10B. The dielectric layer 124 may be made of silicon oxide. The dielectric layer 124 may be deposited by CVD processes such as atmospheric pressure CVD (APCVD), low-pressure CVD (LPCVD), and plasma-enhanced CVD (PECVD).

The metal layer 126 may include Cu, W, Ag, Ag, Sn, Ni, Co, Cr, Ti, Pb, Au, Bi, Sb, Zn, Zr, Mg, In, Te, Ga, other applicable metallic materials, an alloy thereof, or a combination thereof. In some embodiments, the metal layer 126 includes a stacked structure of TiN/AlCu/TiN. The metal layer 126 may be deposited by a physical vapor deposition process (e.g., evaporation or sputtering), an atomic layer deposition process (ALD), an electroplating process, other applicable processes or a combination thereof, and then a chemical mechanical polishing (CMP) process or an etching back process is then optionally performed to remove excess conductive materials.

Next, a dielectric layer 128 is formed over the dielectric layer 124, and a via 130 and a power rail 132 are formed in the dielectric layer 128 in the boundary region 10B, as shown in FIG. 2G-1 in accordance with some embodiments. In some embodiments, the power rail 132 is formed directly above the epitaxial structure 118 in the boundary region 10B and electrically connected to the epitaxial structure 118 in the boundary region 10B. By electrically connecting the epitaxial structure 118 in the boundary region 10B to the power rail 132 in parallel, the power rail resistance may be effectively reduced, and the IR drop may be suppressed, and electron migration may be improved.

The processes for forming the via 130 may be the same as, or similar to, those used to form the first contact structure 122. The processes for forming the power rail 132 may be the same as, or similar to, those used to form the metal layer 126. For the purpose of brevity, the descriptions of these processes are not repeated herein. In some embodiments, the via 130 and the power rail 132 are formed separately. In some embodiments, the via 130 and the power rail 132 are formed at the same time by a dual damascene process.

Next, a second contact structure 134 is formed on the gate stack 120, as shown in FIG. 2G-3 in accordance with some embodiments. In some embodiments, the second contact structure 134 is electrically connected to the gate stack 120. The processes for forming the second contact structure 134 are the same as, or similar to, those used to form the first contact structure 122. For the purpose of brevity, the descriptions of these processes are not repeated herein.

In some embodiments as shown in FIG. 2G-1, the space S between the epitaxial structure 118 in the source/drain region 18 and the epitaxial structure 118 in the boundary region 10B is in a range from about 5% to about 100% of the width W1 of the epitaxial structure 118 in the source/drain region 18. In some other preferred embodiments as shown in FIG. 2G-1, the space S between the epitaxial structure 118 in the source/drain region 18 and the epitaxial structure 118 in the boundary region 10B is in a range from about 10% to about 70% of the width W1 of the epitaxial structure 118 in the source/drain region 18. If the space S is too large, the circuit area may be too large. If the space S is too small, the epitaxial structure 118 in the source/drain region 18 and the epitaxial structure 118 in the boundary region 10B may short-circuit and there may be more defects.

In some embodiments as shown in FIG. 2G-1, the width W2 of the epitaxial structure 118 in the boundary region 10B is in a range from about 10% to about 150% of the width WP of the power rail 132. In some other preferred embodiments as shown in FIG. 2G-1, the width W2 of the epitaxial structure 118 in the boundary region 10B is in a range from about 25% to about 100% of the width WP of the power rail 132. If the width W2 is too wide, the epitaxial structure 118 in the source/drain region 18 and the epitaxial structure 118 in the boundary region 10B may short-circuit. If the width W2 is to narrow, the power rail resistance may still be high.

By forming an extra epitaxial structure 118 under the power rail 132 in the boundary region 10B and electrically connecting the extra epitaxial structure 118 and the power rail 132, the power rail resistance may be effectively reduced, the IR drop may be suppressed, and the electron migration may be improved. Moreover, with the first contact structure 122 filled in the space between the vertically arranged epitaxial layers 118, the power rail resistance may be further reduced.

Many variations and/or modifications may be made to the embodiments of the disclosure. FIGS. 3A-3D are cross-sectional representations of various stages of forming a nanosheet field effect transistor device structure 200, in accordance with some other embodiments of the disclosure. Some processes or devices are the same as, or similar to, those described in the embodiments above, and therefore the descriptions of these processes and devices are not repeated herein. The difference from the embodiments described above is that, as shown in FIGS. 3B-3D in accordance with some embodiments, the epitaxial structures 218 in the source/drain region 18 and the boundary region 10B are single epitaxial blocks.

Figure 3A:
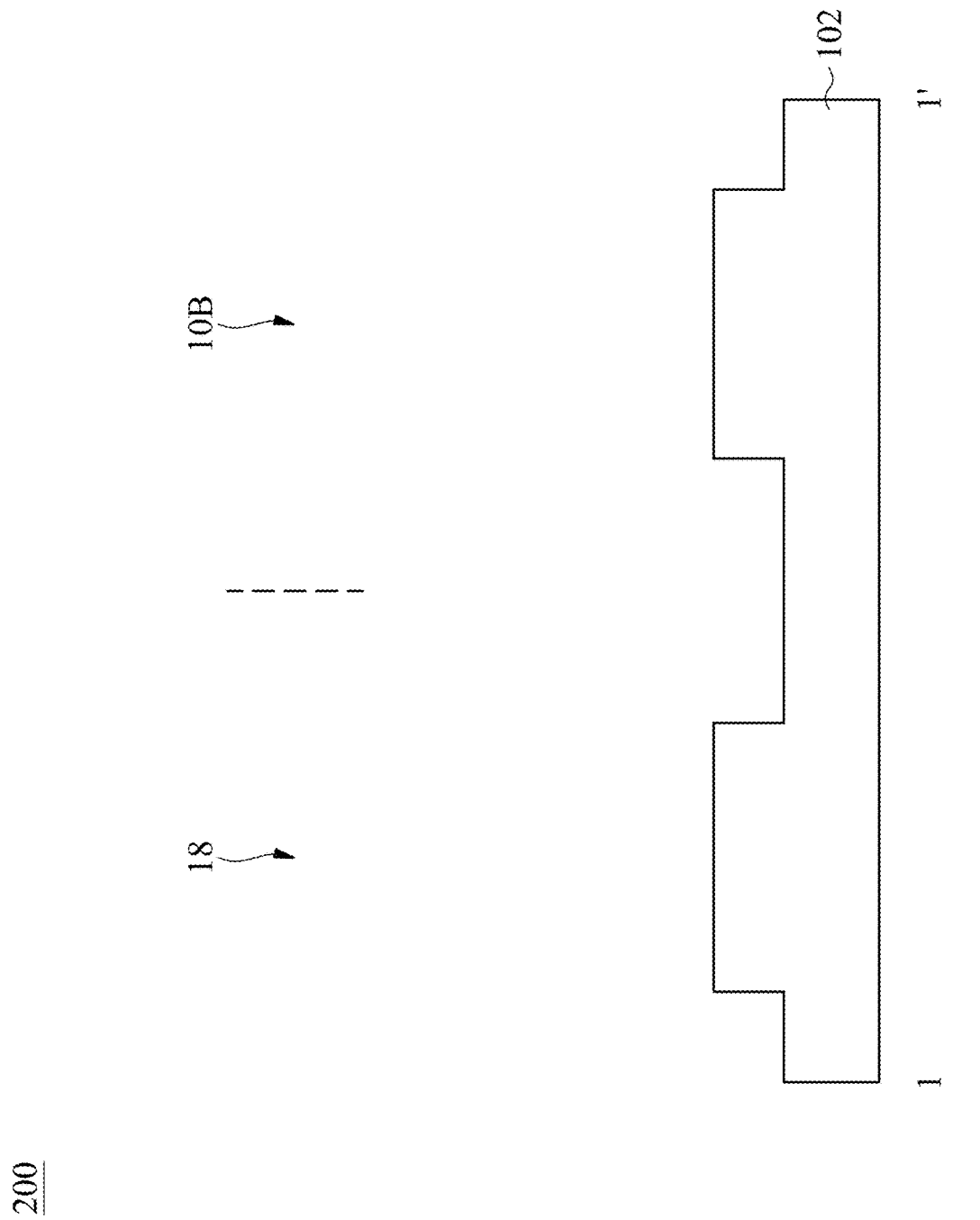
FIGS. 3A-3D are cross-sectional representations of various stages of forming a nanosheet field effect transistor device structure in accordance with some other embodiments.

After the spacers 116 are formed, the first semiconductor layers 106 and the second semiconductor layers 108 in the source/drain region 18 and the boundary region 10B are both removed by an etching process, as shown in FIG. 3A in accordance with some embodiments. The etching process may include dry etching process, wet etching process, reactive ion etching, and/or other suitable etching process. The dry etching process may be performed by an oxygen-containing gas, a fluorine-containing gas (such as $CF_4$, $SF_6$, $CH_2F_2$, $CHF_3$, and/or $C_2F_6$), a chlorine-containing gas (such as $Cl_2$, $CHCl_3$, $CCl_4$, and/or $BCl_3$), bromine-containing gas (such as HBr and/or $CHBR_3$), iodine-containing gas, other suitable gas and/or plasma, or a combination thereof. The wet etching process may be performed in wet etching etchant including diluted hydrofluoric acid (DHF), potassium hydroxide (KOH), ammonia, hydrofluoric acid (HF), nitric acid ($HNO_3$), and/or acetic acid ($CH_3COOH$), other suitable wet etching etchant, or a combination thereof.

Figure 3B:
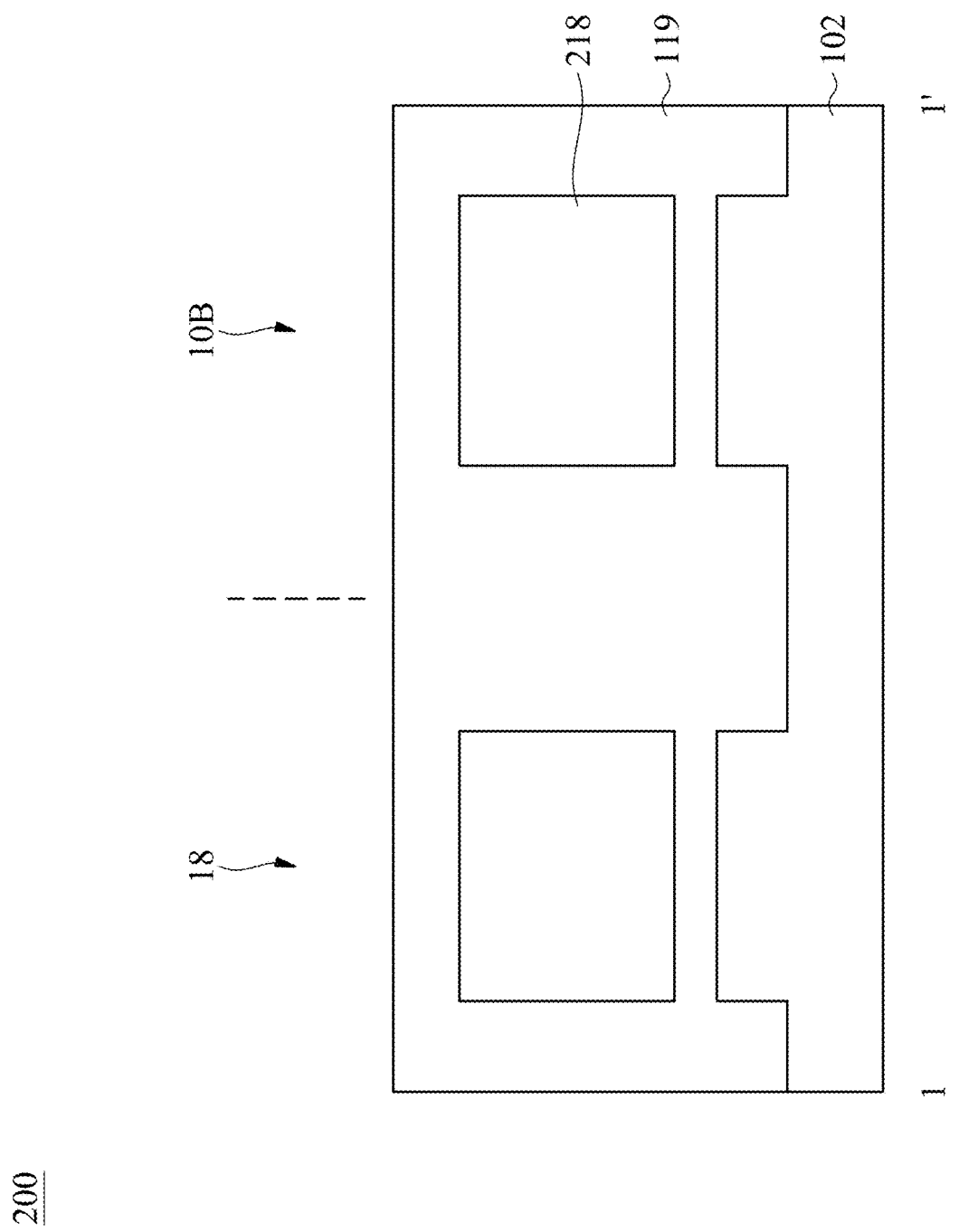

Next, an epitaxial structure 218 which is a single epitaxial block is formed in the source/drain region 18 and the boundary region 10B, as shown in FIG. 3B in accordance with some embodiments. The processes of forming the epitaxial structure 218 are the same as, or similar to, those used to form the epitaxial structure 118 described in the previous embodiments. For the purpose of brevity, the descriptions of these processes are not repeated herein. Compared to the embodiment with vertically arranged epitaxial layers, it is easier to form a single epitaxial block of the epitaxial structure 218, and may improve production yield and transistor current by mobility enhancement.

Figure 3C:
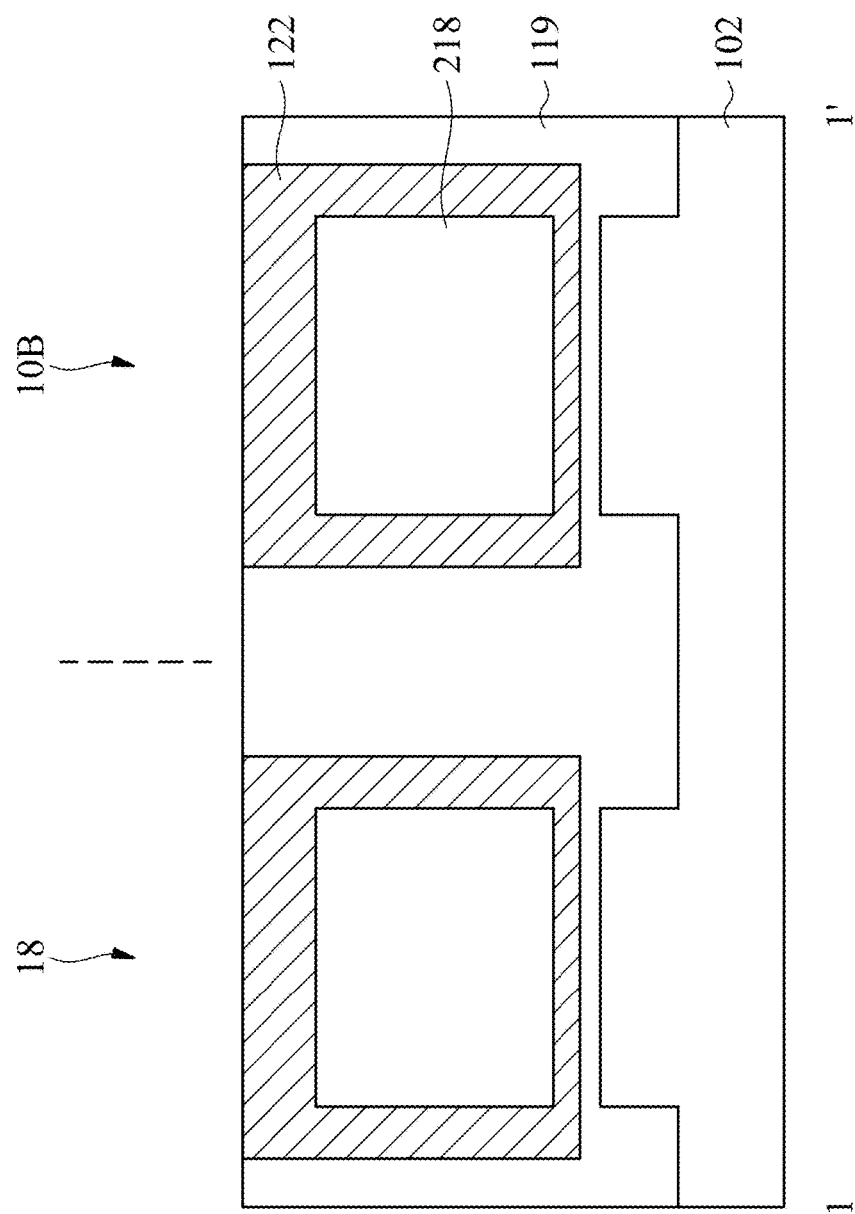

Next, the first contact structure 122 is formed surrounding the epitaxial structure 218 in the source/drain region 18 and the boundary region 10B, as shown in FIG. 3C in accordance with some embodiments. In some embodiments, the epitaxial structure 218 is spaced apart from the substrate as shown in FIG. 3C, and first contact structure 122 wrap around the epitaxial structure 218 to further reduce the resistance. This may improve production yield and transistor current by mobility enhancement.

Figure 3D:
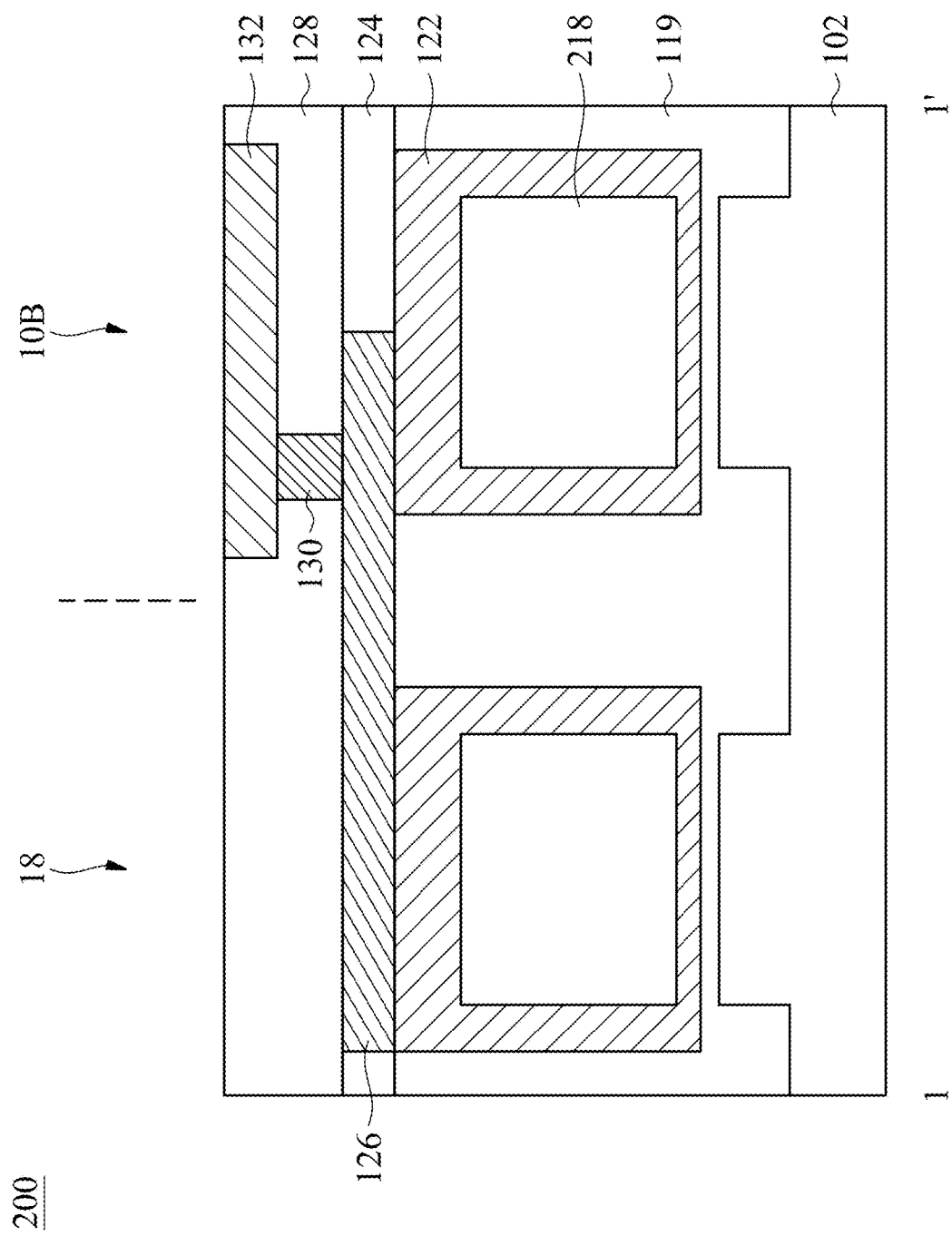

Afterwards, the power rail 132 is formed directly above the epitaxial structure 218 formed in the boundary region 10B, and the power rail 132 is electrically connected to the epitaxial structure 218 formed in the boundary region 10B, as shown in FIG. 3D in accordance with some embodiments.

By forming an extra epitaxial structure 218 under the power rail 132 in the boundary region 10B and electrically connecting the extra epitaxial structure 218 and the power rail 132, the power rail resistance may be effectively reduced, the IR drop may be suppressed, and the electron migration may be improved. Moreover, since the epitaxial structure 218 is a single epitaxial block, it may be easier to wrap around the first contact structure 122, and the production yield may be further improved and transistor current by mobility enhancement.

Many variations and/or modifications may be made to the embodiments of the disclosure. FIGS. 4A-4E are cross-sectional representations of various stages of a modified nanosheet field effect transistor device structure 300, in accordance with some other embodiments of the disclosure. Some processes or devices are the same as, or similar to, those described in the embodiments above, and therefore the descriptions of these processes and devices are not repeated herein. The difference from the embodiments described above is that, as shown in FIG. 4E in accordance with some embodiments, the epitaxial structure 318 in the source/drain region 18 and the epitaxial structure 318 in the boundary region 10B include a different number of epitaxial layers.

Figure 4A:
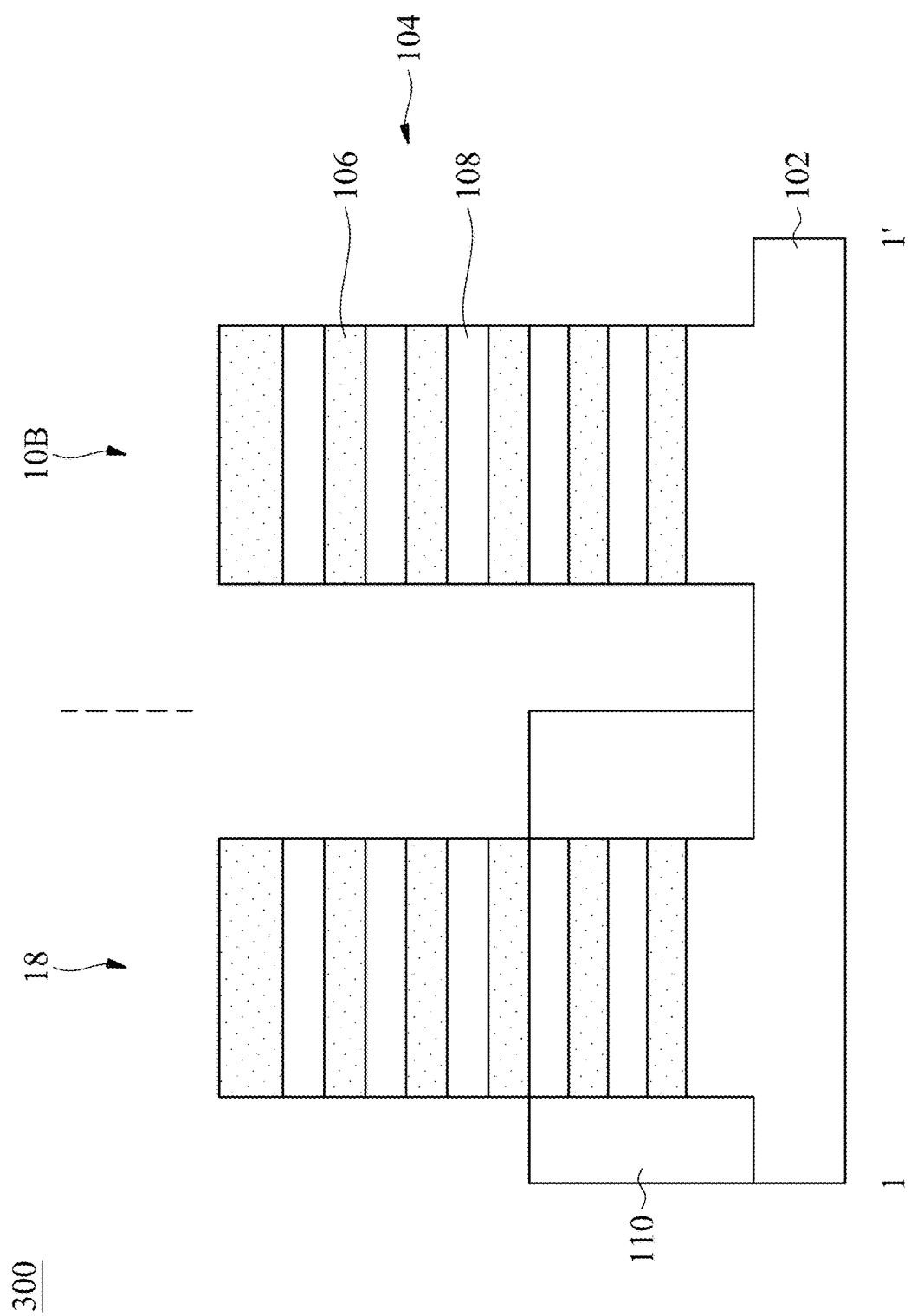
FIGS. 4A-4E are cross-sectional representations of various stages of forming a nanosheet field effect transistor device structure in accordance with some other embodiments.
Figure 4B:
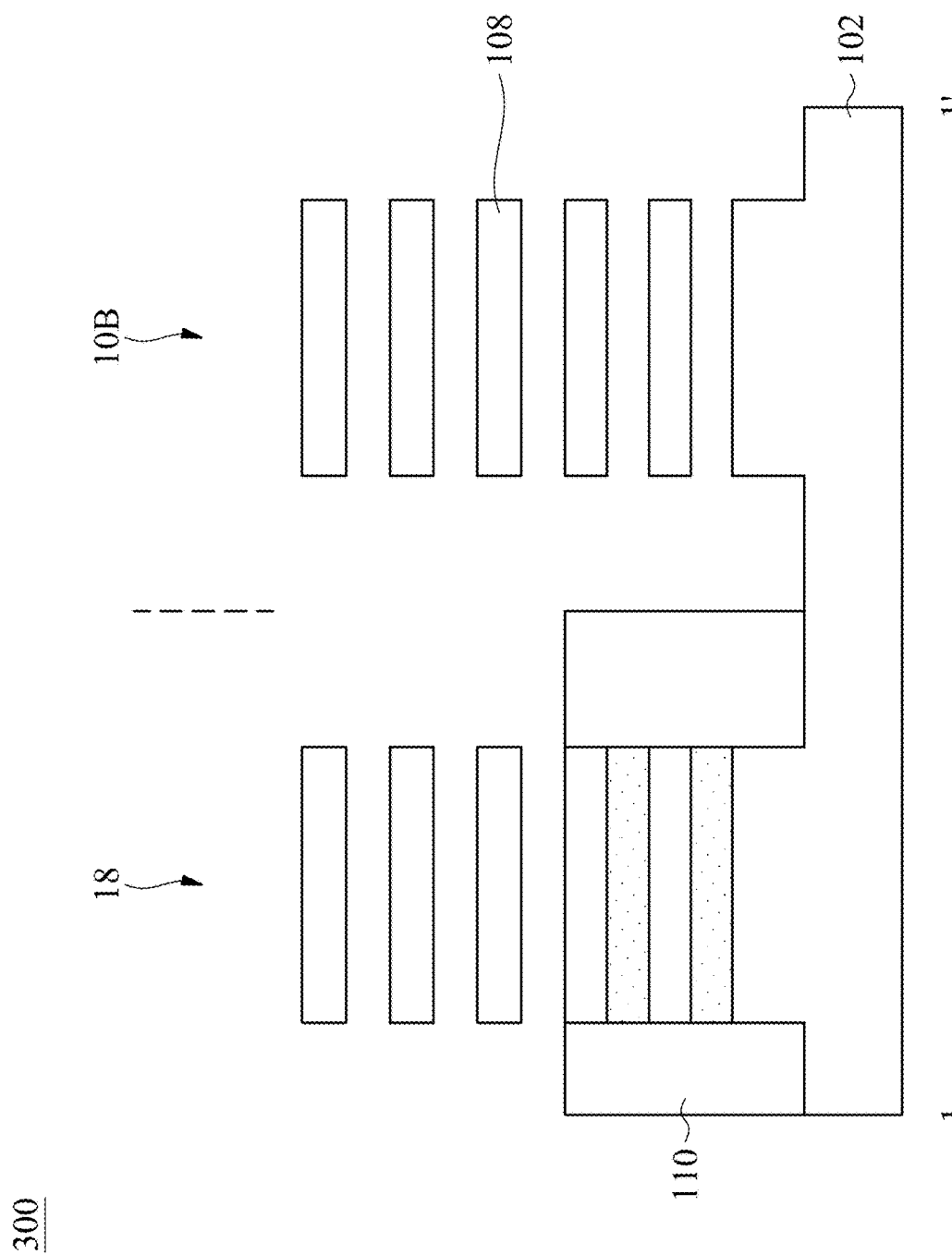

After etching back the isolation layer 110, the number of first semiconductor layers 106 and the second semiconductor layers 108 in the source/drain region 18 and in the boundary region 10B exposed from the isolation layer 110 are different, as shown in FIG. 4A in accordance with some embodiments. In some embodiments, the number of first semiconductor layers 106 and the second semiconductor layers 108 in the boundary region 10B is more than that of in the source/drain region 18. Therefore, after removing the first semiconductor layers 106 exposed from the isolation layer 110, the number of left second semiconductor layers 108 in the source/drain region 18 and in the boundary region 10B exposed from the isolation layer 110 are different, as shown in FIG. 4B in accordance with some embodiments.

Figure 4C:
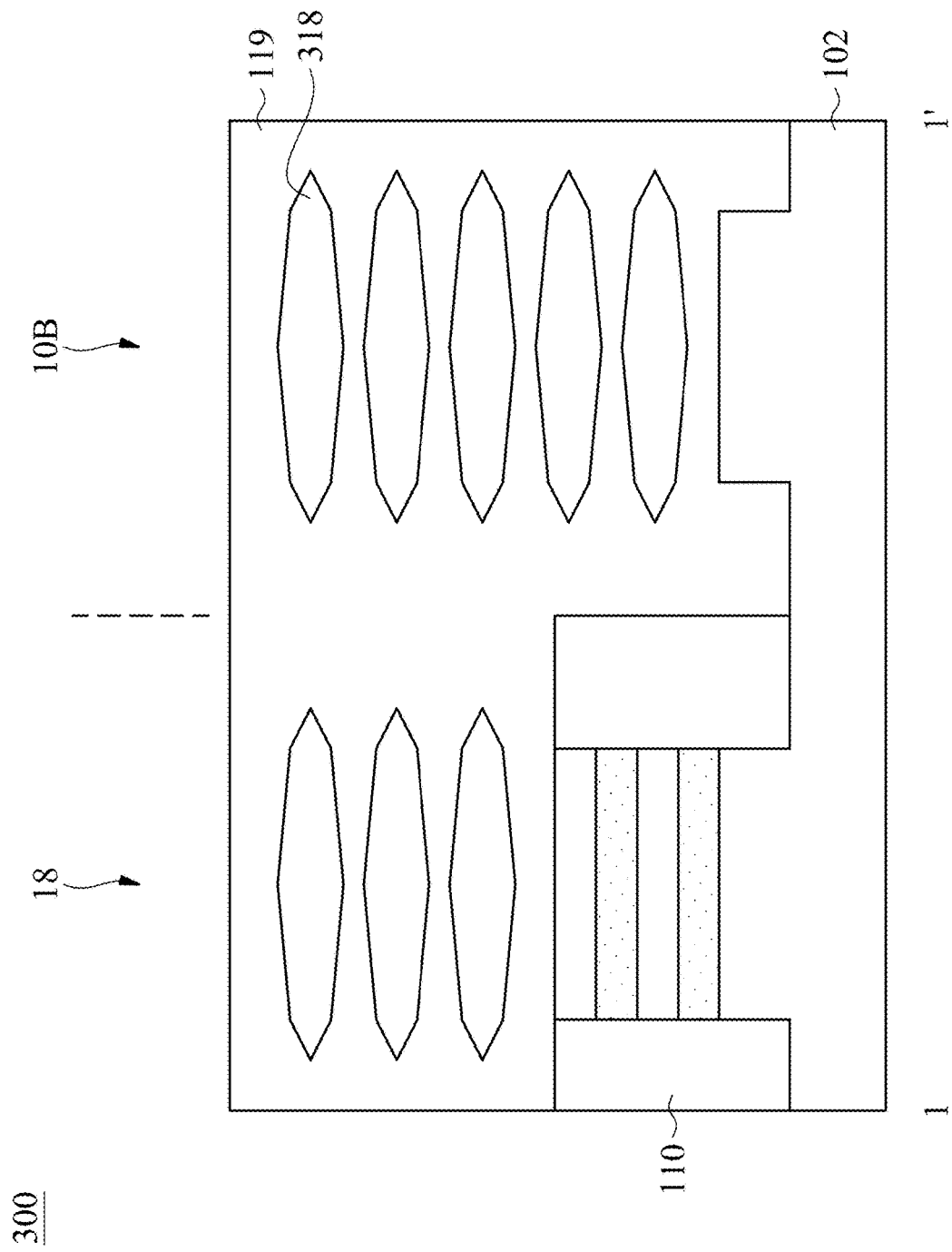
Figure 4D:
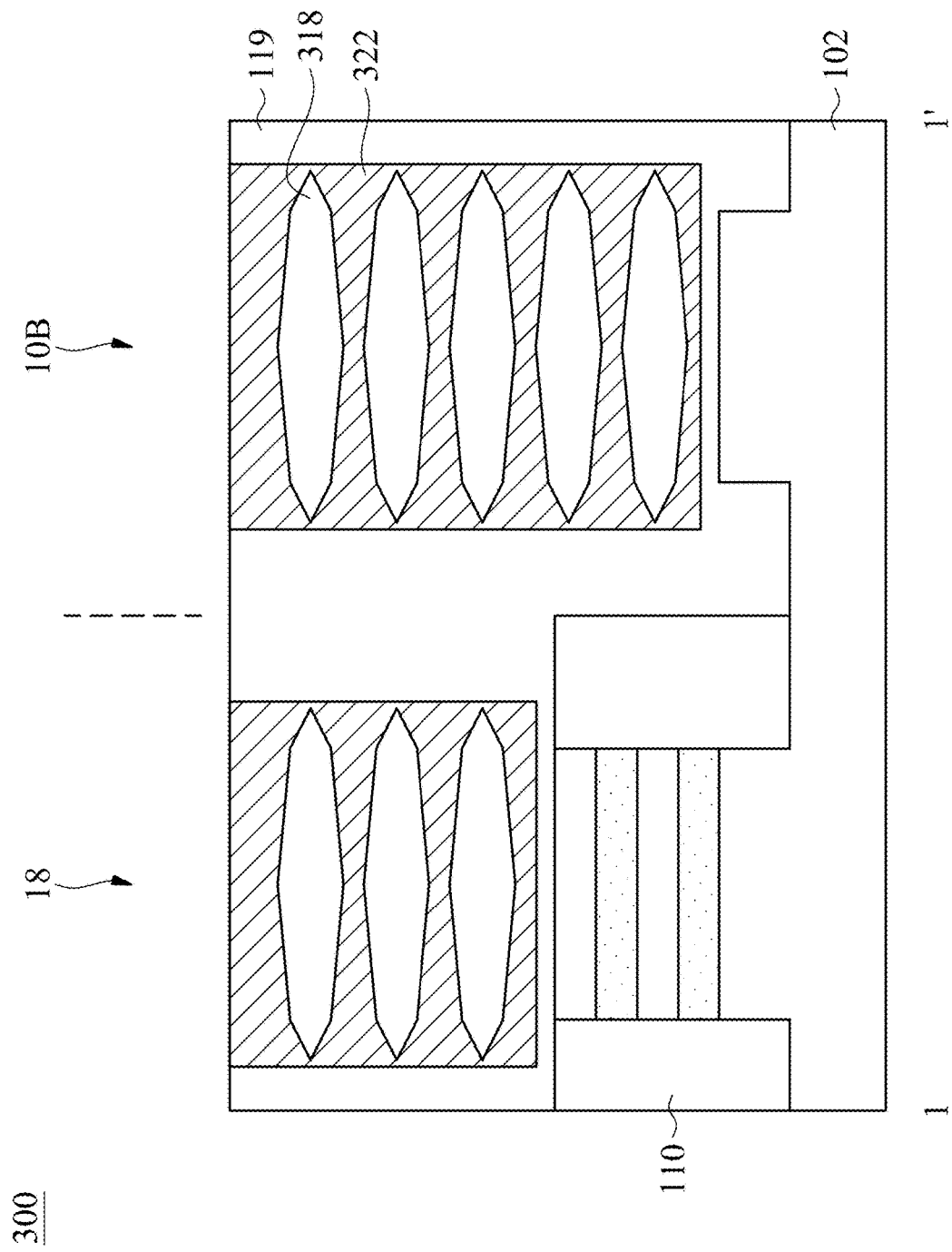
Figure 4E:
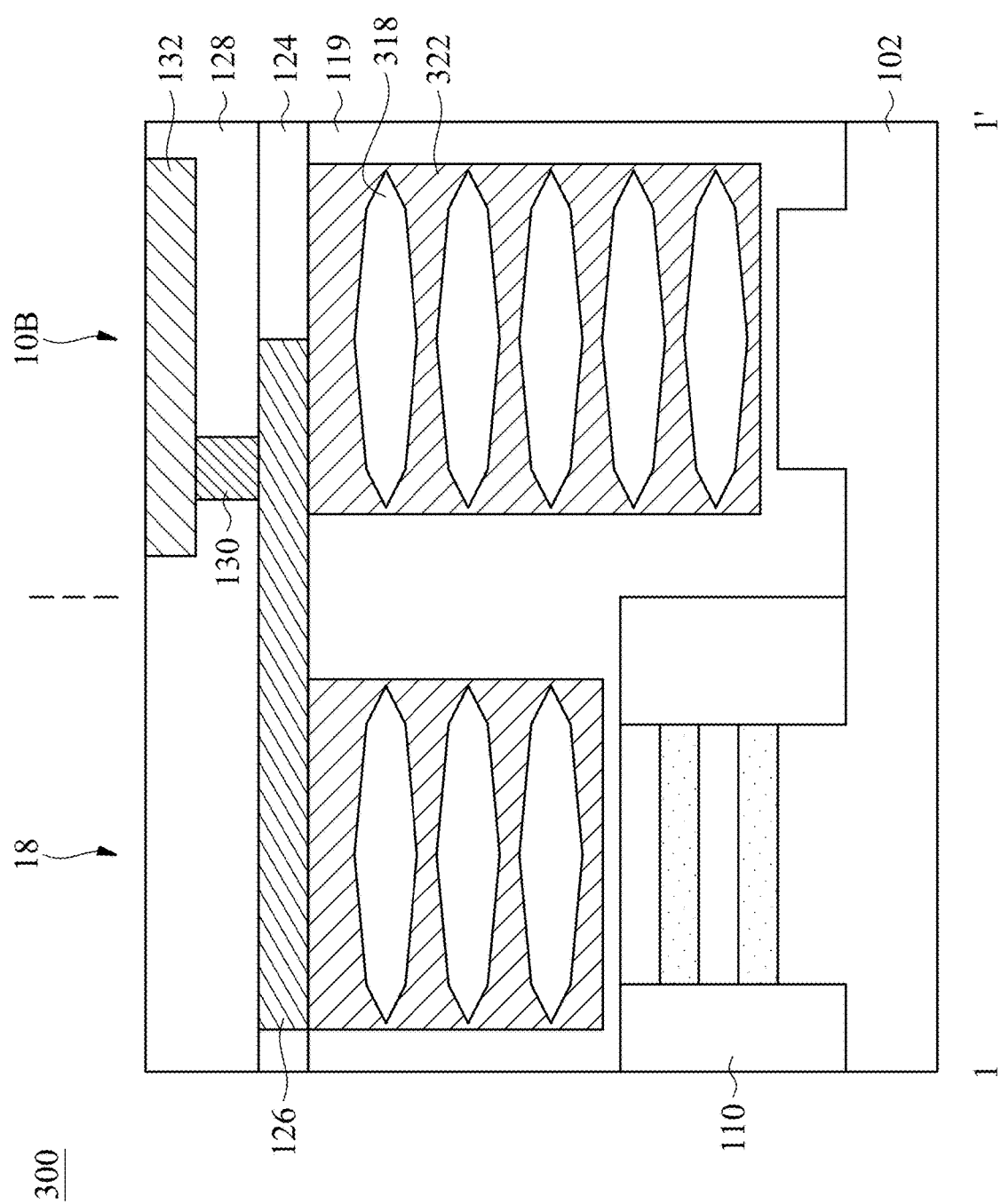

Next, the epitaxial structure 318 is formed at where the second semiconductor layers 108 are exposed from the isolation layer 110, as shown in FIG. 4C in accordance with some embodiments. The number of the epitaxial layers of the epitaxial structure 318 in the source/drain region 18 and in the boundary region 10B may be different. Moreover, as shown in FIGS. 4D and 4E, the contact structure 322 wrapping around the epitaxial structure 318 in the boundary region 10B is larger than that of in the source/drain region 18. Therefore, the resistance of the contact structure 322 in the boundary region 10B is lower than that in the source/drain region 18.

It should be noted that, although there are three epitaxial layers of the epitaxial structure 318 in the source/drain region 18 and five epitaxial layers of the epitaxial structure 318 in the boundary region 10B in the embodiments shown in FIG. 4E, the number of epitaxial layers of the epitaxial structure 318 in the source/drain region 18 and in the boundary region 10B is not limited thereto.

By forming an extra epitaxial structure 318 under the power rail 132 in the boundary region 10B and electrically connecting the extra epitaxial structure 318 and the power rail 132, the power rail resistance may be effectively reduced, the IR drop may be suppressed, and the electron migration may be improved. Moreover, since the epitaxial structure 318 is larger under the power rail 132, the power rail resistance may be further reduced.

Figure 5:
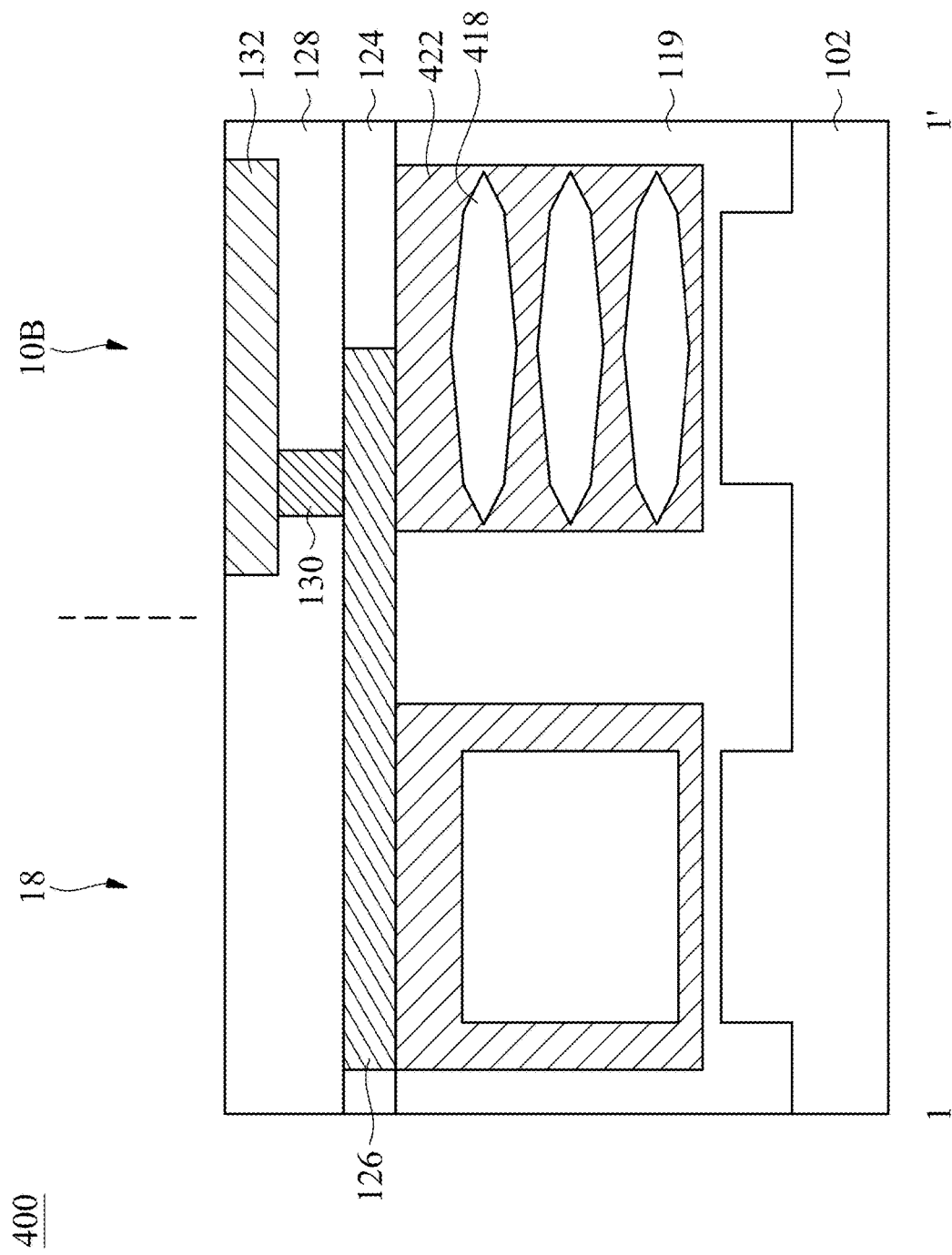
FIG. 5 is a cross-sectional representation of a nanosheet field effect transistor device structure in accordance with some other embodiments.

Many variations and/or modifications may be made to the embodiments of the disclosure. FIG. 5 is a cross-sectional representation of a modified nanosheet field effect transistor device structure 400, in accordance with some other embodiments of the disclosure. Some processes or devices are the same as, or similar to, those described in the embodiments above, and therefore the descriptions of these processes and devices are not repeated herein. The difference from the embodiments described above is that, as shown in FIG. 5 in accordance with some embodiments, the epitaxial structure 418 in the source/drain region 18 includes a single epitaxial block, and the epitaxial structure 418 in the boundary region 10B includes vertically arranged epitaxial layers.

After the spacers 116 are formed, the first semiconductor layers 106 and the second semiconductor layers 108 in the source/drain region 18 are removed by an etching process, as shown in FIG. 5 in accordance with some embodiments. Meanwhile, only the first semiconductor layers 106 in the boundary region 10B are removed by the etching process. Therefore, a single epitaxial block may be formed in the source/drain region 18 and vertically arranged epitaxial layers may be formed in the boundary region 10B. Since in the boundary region 10B the epitaxial layers 418 are vertically arranged, the first contact structure 422 filled in the space between the vertically arranged epitaxial layers 418. The contact structure 422 may have a lower resistance in the boundary region 10B than in the source/drain region 18, and the power rail resistance may be further reduced.

By forming an extra epitaxial structure 418 under the power rail 132 in the boundary region 10B and electrically connecting the extra epitaxial structure 418 and the power rail 132, the power rail resistance may be effectively reduced, the IR drop may be suppressed, and the electron migration may be improved. Since the epitaxial structure 418 in the source/drain region 18 is a single epitaxial block, it may be easier to wrap around the first contact structure 422, and the production yield may be further improved and transistor current by mobility enhancement. Moreover, since the epitaxial structure 418 in the boundary region 10B is vertically arranged epitaxial layers, the power rail resistance may be further reduced.

Figure 6:
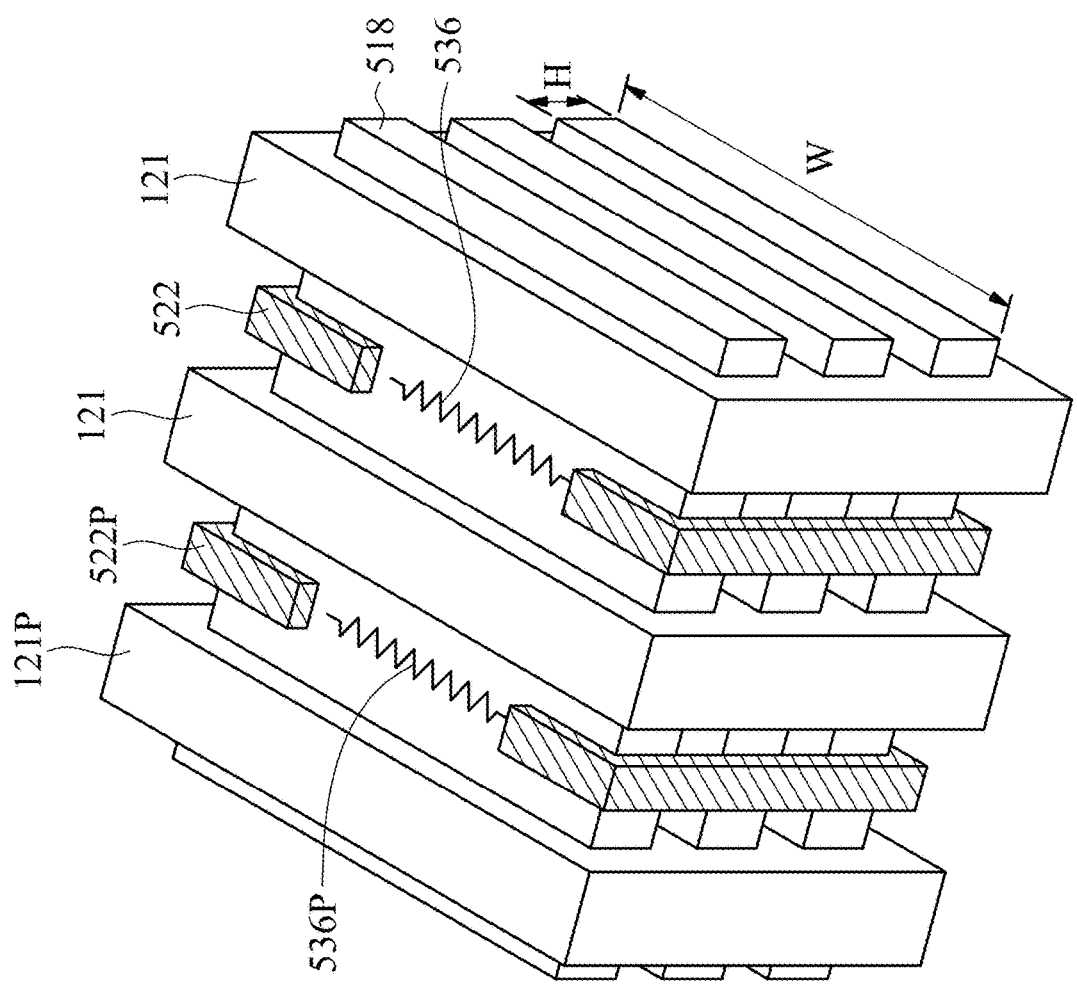
FIG. 6 is a perspective representation of a nanosheet field effect transistor device structure in accordance with some further embodiments.
Figure 7:
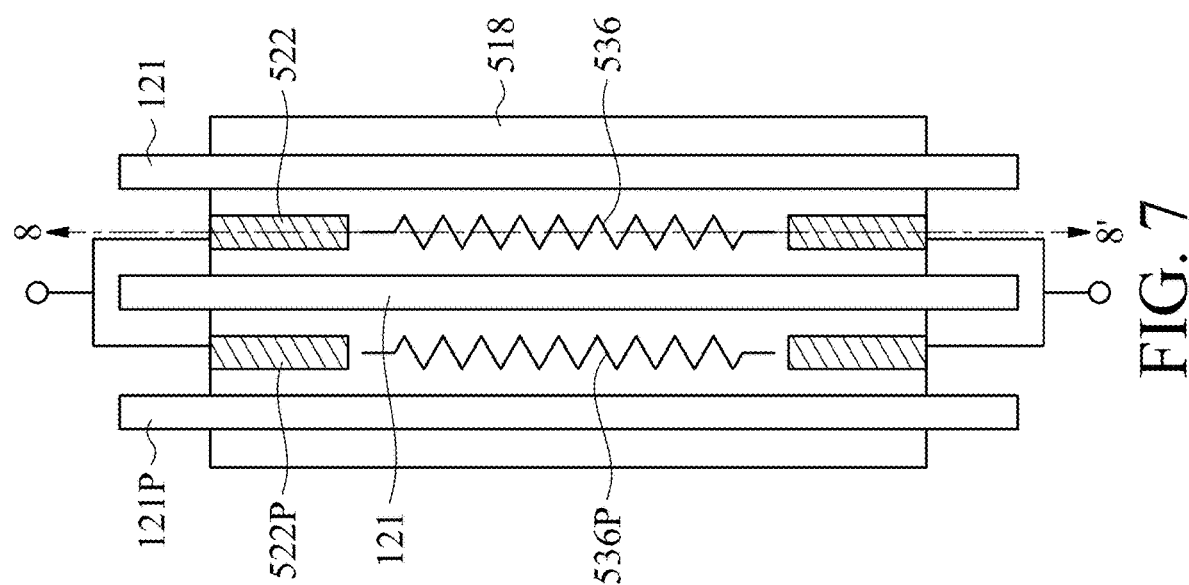
FIG. 7 is a top view of a nanosheet field effect transistor device structure in accordance with some further embodiments.
Figure 8:
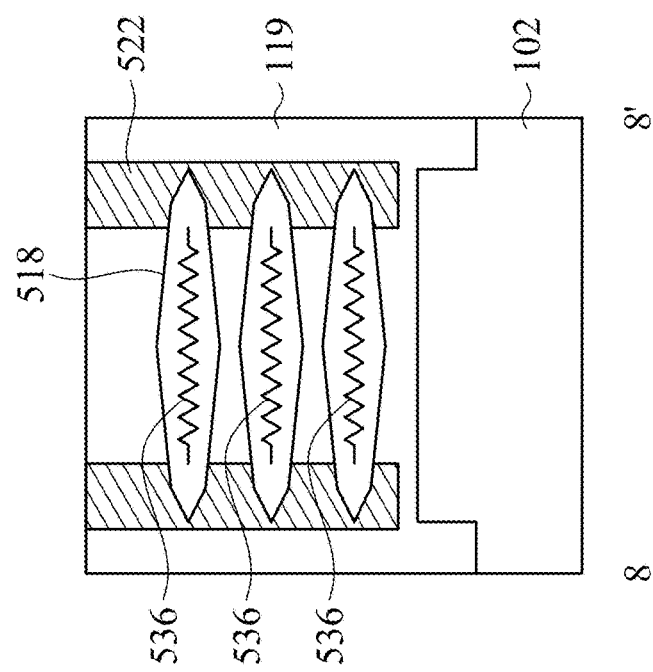
FIG. 8 is a cross-sectional representation of a nanosheet field effect transistor device structure in accordance with some further embodiments.

Many variations and/or modifications may be made to the embodiments of the disclosure. FIG. 6 is a perspective representation of a modified nanosheet field effect transistor device structure 500 in accordance with some further embodiments. FIG. 7 is a top view of a modified nano sheet field effect transistor device structure 500 in accordance with some further embodiments. FIG. 8 is a cross-sectional representation of a modified nanosheet field effect transistor device structure 500 in accordance with some further embodiments. FIG. 8 shows a cross-sectional representation taken along line 8-8' in FIG. 7. Some processes or devices are the same as, or similar to, those described in the embodiments above, and therefore the descriptions of these processes and devices are not repeated herein. The difference from the embodiments described above is that, as shown in FIGS. 6-8 in accordance with some embodiments, between the gate structures 121, a pair of contact structures 522 are disposed on opposite sides of the epitaxial structure 518. Moreover, each of the contact structures 522 surrounds a portion of the epitaxial structure 518, and the pair of contact structures 522 are spaced apart from each other by the epitaxial structure 518.

The contact structures 522 are formed on opposite sides of the epitaxial structure 518, as shown in FIGS. 6-8 in accordance with some embodiments. Therefore, a resistor 536 is formed at the epitaxial structure 518 between the contact structures 522. Compared to the conventional resistor design, the resistor 536 between the contact structures 522 may be formed without extra masks and the chip area may be reduced.

As shown in FIGS. 6 and 7 in accordance with some embodiments, by forming another pair of contact structures 522P between the gate structures 121 and another gate structure 121P parallel to gate structures 121, another resistor 536P is formed between the contact structures 522P. Moreover, as shown in FIG. 7 in accordance with some embodiments, the contact structures 522 are electrically connected to the contact structures 522P at each end. Therefore, the resistors 536 and 536P between the contact structures 522 and 522P are connected in parallel.

It should be noted that, although there are three gate structures 121 and 121P and two pair of contact structures 522 and 522P in the embodiments shown in FIGS. 6 and 7, the number of gate structures 121 and 121P and contact structures 522 and 522P is not limited thereto. The number of gate structures 121 and 121P and contact structures 522 and 522P may be modified, depending on the demands on the resistance of the resistor.

In some embodiments as shown in FIG. 6, the ratio of width W to height H of the epitaxial structure 518 is in a range from about 100% to about 1000%. If the ratio is too high, it may not be easy to form an epitaxial structure 518 between the gate structures 121. If the ratio is too low, extra chip area may be needed to meet the resistance requirements. The width W of the epitaxial structure 518 may be modified, depending on the demands on the resistance of the resistor 536.

The epitaxial structure 518 may include vertically arranged epitaxial layers as shown in FIG. 8 in accordance with some embodiments. Therefore, the resistance of the resistor 536 is the parallel resistance of each epitaxial layer is connected in parallel between the contact structures 522. By forming epitaxial structure 518 between a pair of contact structures 522 and 522P, a resistor 536 is formed without using an extra mask. The resistance of the resistor 536 may be modified by changing the width W of the epitaxial structure 518 and the number of epitaxial structures 518 connected in parallel.

Figure 9:
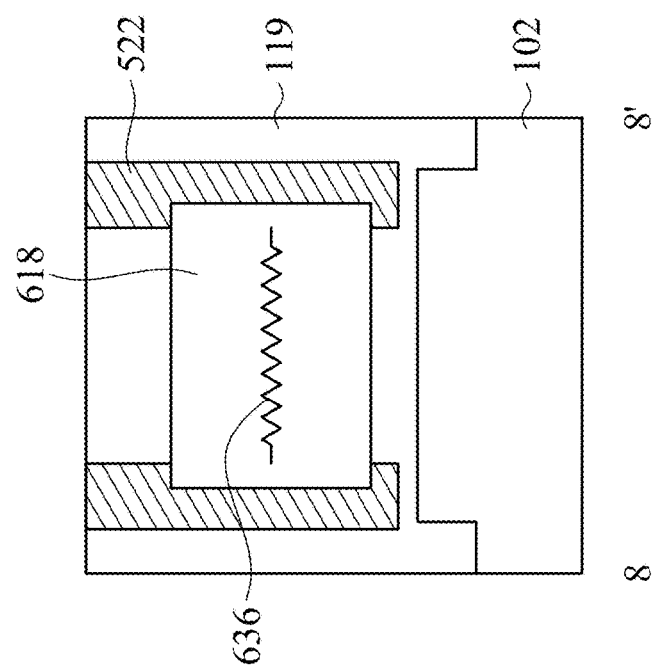
FIG. 9 is a cross-sectional representation of a nanosheet field effect transistor device structure in accordance with some other embodiments.

Many variations and/or modifications may be made to the embodiments of the disclosure. FIG. 9 is a cross-sectional representation of a modified nanosheet field effect transistor device structure 600 in accordance with some further embodiments. Some processes or devices are the same as, or similar to, those described in the embodiments above, and therefore the descriptions of these processes and devices are not repeated herein. The difference from the embodiments described above is that, as shown in FIG. 9 in accordance with some embodiments, the epitaxial structure 618 includes a single epitaxial block.

In some embodiments, the epitaxial structure 618 is formed by removing the first semiconductor layers 106 and the second semiconductor layers 108 between the gate structures 121 by an etching process and forming a single epitaxial block between the gate structures 121. Therefore, it may be easier to form the epitaxial structure 618, and the production yield may be further improved and transistor current by mobility enhancement.

By forming the epitaxial structure 618 between a pair of contact structures 522, a resistor 636 is formed without using an extra mask. The resistance of the resistor 636 may be modified by adjusting the width W of the epitaxial structure 618 and the number of epitaxial structures 618 connected in parallel. Moreover, since the epitaxial structure 618 includes a single epitaxial block, it may be easier to be formed the epitaxial structure 618, and the production yield may be further improved and transistor current by mobility enhancement.

Figure 10:
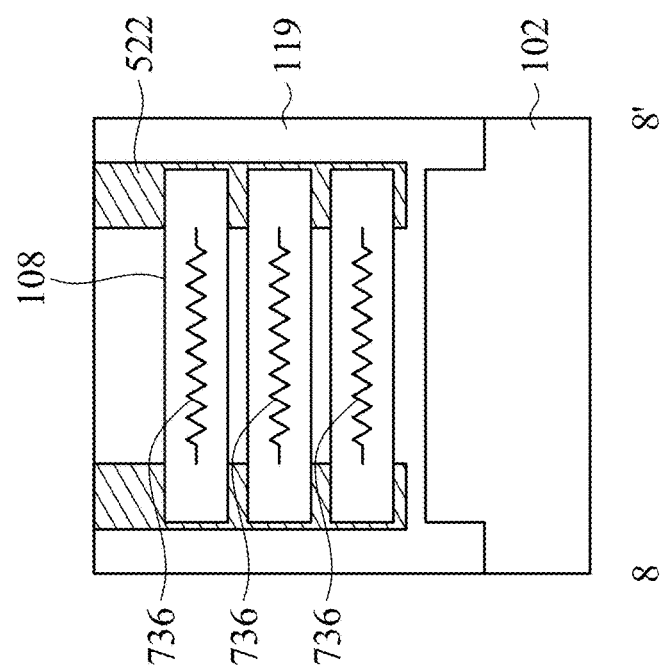
FIG. 10 is a cross-sectional representation of a nanosheet field effect transistor device structure in accordance with some other embodiments.

Many variations and/or modifications may be made to the embodiments of the disclosure. FIG. 10 is a cross-sectional representation of a modified nanosheet field effect transistor device structure 700 in accordance with some further embodiments. Some processes or devices are the same as, or similar to, those described in the embodiments above, and therefore the descriptions of these processes and devices are not repeated herein. The difference from the embodiments described above is that, as shown in FIG. 10 in accordance with some embodiments, the epitaxial structure is not formed and the second semiconductor layers 108 are left between the gate structures as the body of resistor 736.

By forming the second semiconductor layers 108 between a pair of contact structures 522, a resistor 736 is formed without using an extra mask. The resistance of the resistor 736 may be modified by adjusting the width W of the second semiconductor layers 108 and the number of second semiconductor layers 108 connected in parallel. Moreover, by taking the second semiconductor layers 108 is as the body of the resistor 736, it may save the production cost and time.

As mentioned above, in the present disclosure, a method of forming a nanosheet field effect transistor device structure is provided. With an extra epitaxial structure directly under the power rail, the power rail resistance may be reduced, the IR drop may be suppressed, and the electron migration may be improved. With vertically arranged epitaxial layers, the power rail resistance may be further reduced. With a single epitaxial block, the production yield may be improved and transistor current by mobility enhancement. With contact structures formed on opposite sides of the epitaxial structure, a resistor may be formed without using an extra mask. The resistance of the resistor may be fine-tuned by modifying the dimensions of the epitaxial structure, or connecting the same epitaxial structures in parallel.

It should be noted that although some of the benefits and effects are described in the embodiments above, not every embodiment needs to achieve all the benefits and effects.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device structure, comprising:
    forming a nanosheet stack comprising vertically alternately stacked first semiconductor layers and second semiconductor layers on a substrate, wherein the substrate comprises a device region and a boundary region, and the device region comprises a channel region and a source/drain region;
    removing the nanosheet stack and forming epitaxial structures in the source/drain region and the boundary region;
    removing the first semiconductor layers of the nanosheet stack in the channel region and forming a gate stack surrounding the second semiconductor layers;
    forming a contact structure surrounding the epitaxial structures in the source/drain region and the boundary region; and
    forming a power rail in the boundary region directly above the epitaxial structure in the boundary region, wherein the power rail is electrically connected to the epitaxial structure in the boundary region,
    wherein the epitaxial structures in the source/drain region and the epitaxial structures in the boundary region are spaced apart from each other.

2. The method for forming the semiconductor device structure as claimed in claim 1, wherein forming the epitaxial structures in the source/drain region or the boundary region comprises forming a plurality of vertically arranged epitaxial layers.

3. The method for forming the semiconductor device structure as claimed in claim 2, wherein the epitaxial structures in the source/drain region and the epitaxial structures in the boundary region comprise a different number of epitaxial layers.

4. The method for forming the semiconductor device structure as claimed in claim 2, wherein the epitaxial structures in the source/drain region and the epitaxial structures in the boundary region comprise a same number of epitaxial layers.

5. The method for forming the semiconductor device structure as claimed in claim 1, wherein forming the epitaxial structures in the source/drain region or the boundary region comprises forming a single epitaxial block.

6. The method for forming the semiconductor device structure as claimed in claim 1, further comprising:
    forming a dummy gate covering the nanosheet stack in the channel region before forming the epitaxial structures in the source/drain region and the boundary region.

7. The method for forming the semiconductor device structure as claimed in claim 6, further comprising:
    forming a spacer layer on the sidewalls of the dummy gate before removing the nanosheet stack in the source/drain region and the boundary region.

8. The method for forming the semiconductor device structure as claimed in claim 6, further comprising:
    removing the dummy gate in the channel region before removing the first semiconductor layers of the nanosheet stack in the channel region.

9. The method for forming the semiconductor device structure as claimed in claim 1, wherein the first semiconductor layers and second semiconductor layers are made of different materials.

10. The method for forming the semiconductor device structure as claimed in claim 1, wherein a space between the epitaxial structures in the source/drain region and the epitaxial structures in the boundary region is in a range from about 10% to about 70% of a width of the epitaxial structures in the source/drain region.

11. The method for forming the semiconductor device structure as claimed in claim 1, wherein a width of the epitaxial structures in the boundary region is in a range from about 25% to about 100% of a width of the power rail.

12. The method for forming the semiconductor device structure as claimed in claim 1, wherein a ratio of a width and a height of the epitaxial structures in the source/drain region is in a range from about 100% to about 1000%.

* * * * *